US006566682B2

(12) United States Patent
Forbes

(10) Patent No.: US 6,566,682 B2
(45) Date of Patent: May 20, 2003

(54) PROGRAMMABLE MEMORY ADDRESS AND DECODE CIRCUITS WITH ULTRA THIN VERTICAL BODY TRANSISTORS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/780,126

(22) Filed: Feb. 9, 2001

(65) Prior Publication Data

US 2002/0109138 A1 Aug. 15, 2002

(51) Int. Cl.$^7$ .............................................. H01L 29/04
(52) U.S. Cl. ..................... 257/51; 257/302; 438/131; 438/600; 438/242; 365/230.06; 365/230.02
(58) Field of Search ................................. 257/724, 749, 257/704, 678, 685, 686, 707, 680, 314–319, 49–51, 64–69, 302, 352, 353, 505; 365/230.06, 230.02, 185.02, 185.05, 185.18, 185.29, 185.21, 185.22; 438/96–97, 482, 488, 131, 600, 150, 166, 149–152, 157, 242

(56) References Cited

U.S. PATENT DOCUMENTS

| | | | |
|---|---|---|---|
| 5,936,274 A | 8/1999 | Forbes et al. | 257/315 |
| 5,973,356 A | 10/1999 | Noble et al. | 257/319 |
| 5,991,225 A * | 11/1999 | Forbes et al. | 365/230.02 |
| 6,072,209 A | 6/2000 | Noble et al. | 257/296 |
| 6,124,729 A | 9/2000 | Noble et al. | 326/41 |
| 6,134,175 A * | 10/2000 | Forbes et al. | 257/302 |
| 6,150,687 A | 11/2000 | Noble et al. | 257/302 |
| 6,153,468 A | 11/2000 | Forbes et al. | 438/257 |
| 6,238,976 B1 | 5/2001 | Noble et al. | 438/259 |
| 6,281,054 B1 * | 8/2001 | Yeo | 438/149 |

OTHER PUBLICATIONS

Hergenrother, J.M., "The Vertical Replacement–Gate (VRG) MOSFET: A 50nm Vertical MOSFET with Lithography–Independent Gate Length", *IEEE*, pp. 75–78, (1999).
Kalavade, P., et al., "A Novel sub–10nm Transistor", *IEEE Device Research Conference*, Denver, Co., pp. 71–72, (2000).
Xuan, P., et al., "60nm Planarized Ultra–thin Body Solid Phase Epitaxy MOSFETS", *IEEE Device Research Conference*, Denver, Co. pp. 67–68, (2000).

* cited by examiner

Primary Examiner—Hoai Ho
Assistant Examiner—Long Tran
(74) Attorney, Agent, or Firm—Schwegman, Lundberg, Woessner & Kluth, P.A.

(57) ABSTRACT

Structures and method for programmable memory address and decode circuits with ultra thin vertical body transistors are provided. The memory address and decode circuits includes a number of address lines and a number of output lines such that the address lines and the output lines form an array. A number of vertical pillars extend outwardly from a semiconductor substrate at intersections of output lines and address lines. Each pillar includes a single crystalline first contact layer and a second contact layer separated by an oxide layer. A number of single crystalline ultra thin vertical floating gate transistors that are selectively disposed adjacent the number of vertical pillars. Each single crystalline vertical floating gate transistor includes an ultra thin single crystalline vertical first source/drain region coupled to the first contact layer, an ultra thin single crystalline vertical second source/drain region coupled to the second contact layer, and an ultra thin single crystalline vertical body region which opposes the oxide layer and couples the first and the second source/drain regions. A floating gate opposes the ultra thin single crystalline vertical body region. Each of the number of address lines is disposed between rows of the pillars and opposes the floating gates of the single crystalline vertical floating gate transistors for serving as a control gate.

54 Claims, 18 Drawing Sheets

PROGRAMMABLE MEMORY ADDRESS AND DECODE CIRCUITS WITH ULTRA THIN VERTICAL BODY TRANSISTORS

CROSS REFERENCE TO RELATED APPLICATIONS

This application is related to the following co-pending, commonly assigned U.S. patent applications: "Open Bit Line DRAM with Ultra Thin Body Transistors," Ser. No. 09/780,125, "Folded Bit Line DRAM with Ultra Thin Body Transistors," Ser. No. 09/780,130, "Programmable Logic Arrays with Ultra Thin Body Transistors," Ser. No. 09/780,087, "Memory Address and Decode Circuits with Ultra Thin Body Transistors," Ser. No. 09/780,144, "In Service Programmable Logic Arrays with Ultra Thin Body Transistors," Ser. No. 09/780,129, and "Flash Memory with Ultra Thin Vertical Body Transistors," Ser. No. 09/780,169, which are filed on even date herewith and each of which disclosure is herein incorporated by reference.

FIELD OF THE INVENTION

The present invention relates generally to integrated circuits, and in particular to Flash memory with ultra thin vertical body transistors.

BACKGROUND OF THE INVENTION

Modern electronic systems typically include a data storage device such as a dynamic random access memory (DRAM), static random access memory (SRAM), video random access memory (VRAM), erasable programmable read only memory (EPROM), flash memory, or other conventional memory device. As these systems become more sophisticated, they require more and more memory in order to keep pace with the increasing complexity of software based applications that run on the systems. Thus, as the technology relating to memory devices has evolved, designers have tried to increase the density of the components of the memory device. For example, the electronics industry strives to decrease the size of memory cells that store the data in the memory device. This allows a larger number of memory cells to be fabricated without substantially increasing the size of the semiconductor wafer used to fabricate the memory device.

Memory devices store data in vast arrays of memory cells. Essentially, the cells are located at intersections of wordlines and bitlines (rows and columns of an array). Each cell conventionally stores a single bit of data as a logical "1" or a logical "0" and can be individually accessed or addressed. Conventionally, each cell is addressed using two multi-bit numbers. The first multi-bit number, or row address, identifies the row of the memory array in which the memory cell is located. The second multi-bit number, or column address, identifies the column of the memory array in which the desired memory cell is located. Each row address/column address combination corresponds to a single memory cell.

To access an individual memory cell, the row and column addresses are applied to inputs of row and column decoders, respectively. Conventionally, row and column decoders are fabricated using programmable logic arrays. These arrays are configured so as to select desired word and bit lines based on address signals applied to the inputs of the array. As with the array of memory cells, the decoder arrays use a portion of the surface area of the semiconductor wafer. Thus, designers also strive to reduce the surface area required for the decoder arrays.

Memory devices are fabricated using photolithographic techniques that allow semiconductor and other materials to be manipulated to form integrated circuits as is known in the art. These photolithographic techniques essentially use light that is focussed through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of the photolithographic process. The minimum feature size imposes one constraint on the size of the components of a memory device, including the decoder array. In order to keep up with the demands for higher capacity memory devices, designers search for other ways to reduce the size of the components of the memory device, including the decoder array.

As the density requirements become higher and higher in gigabit DRAMs and beyond, it becomes more and more crucial to minimize device area. The NOR address decode circuit is one example of an architecture for row and column decoders.

Flash memory cells are one possible solution for high density memory requirements. Flash memories include a single transistor, and with high densities would have the capability of replacing hard disk drive data storage in computer systems. This would result in delicate mechanical systems being replaced by rugged, small and durable solid-state memory packages, and constitute a significant advantage in computer systems. What is required then is a flash memory with the highest possible density or smallest possible cell area.

The continuous scaling, however, poses problems even for flash memories since the single transistor in the flash memory has the same design rule limitations of conventional MOSFET technology. That is, the continuous scaling to the deep sub-micron region where channel lengths are less than 0.1 micron, 100 nm, or 1000 Å causes significant problems in the conventional transistor structures. As shown in FIG. 1, junction depths should be much less than the channel length of 1000 Å, or this implies junction depths of a few hundred Angstroms. Such shallow junctions are difficult to form by conventional implantation and diffusion techniques. Extremely high levels of channel doping are required to suppress short-channel effects such as drain-induced barrier lowering; threshold voltage roll off, and sub-threshold conduction. Sub-threshold conduction is particularly problematic in MOSFET technology as it reduces the charge storage retention time on the capacitor cells. These extremely high doping levels result in increased leakage and reduced carrier mobility. Thus making the channel shorter to improve performance is negated by lower carrier mobility.

Therefore, there is a need in the art to provide improved flash memory densities while avoiding the deleterious effects of short-channel effects such as drain-induced barrier lowering; threshold voltage roll off, and sub-threshold conduction, increased leakage and reduced carrier mobility. At the same time charge storage retention time must be maintained.

SUMMARY OF THE INVENTION

The above mentioned problems with memory address and decode circuits and other problems are addressed by the present invention and will be understood by reading and studying the following specification. Systems and methods are provided for programmable memory address and decode circuits with ultra thin vertical body transistors where the surface space charge region scales down as other transistor dimensions scale down.

In one embodiment of the present invention, a programmable memory decoder is provided. The memory programmable memory decoder includes a number of address lines and a number of output lines such that the address lines and the output lines form an array. A number of vertical pillars extend outwardly from a semiconductor substrate at intersections of output lines and address lines. Each pillar includes a single crystalline first contact layer and a second contact layer separated by an oxide layer. A number of single crystalline ultra thin vertical floating gate transistors that are selectively disposed adjacent the number of vertical pillars. Each single crystalline vertical floating gate transistor includes an ultra thin single crystalline vertical first source/drain region coupled to the first contact layer, an ultra thin single crystalline vertical second source/drain region coupled to the second contact layer, and an ultra thin single crystalline vertical body region which opposes the oxide layer and couples the first and the second source/drain regions. A floating gate opposing the ultra thin single crystalline vertical body region. Each of the number of address lines is disposed between rows of the pillars and opposes the floating gates of the single crystalline vertical floating gate transistors for serving as a control gate.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

Figure 1:
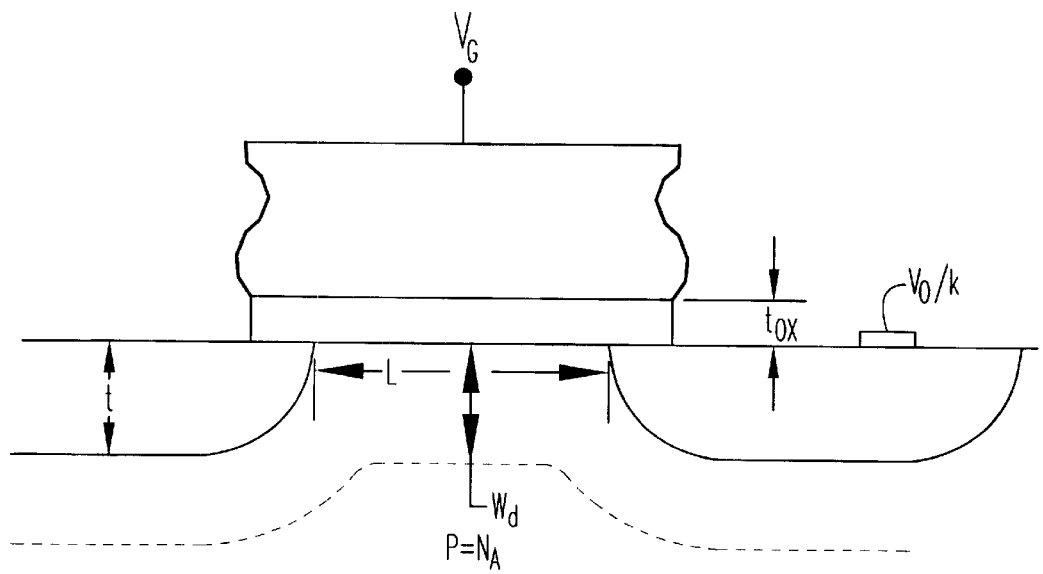
FIG. 1 is an illustration of a convention MOSFET transistor illustrating the shortcomings of such conventional MOSFETs as continuous scaling occurs to the deep submicron region where channel lengths are less than 0.1 micron, 100 nm, or 1000 Å.
Figure 2:
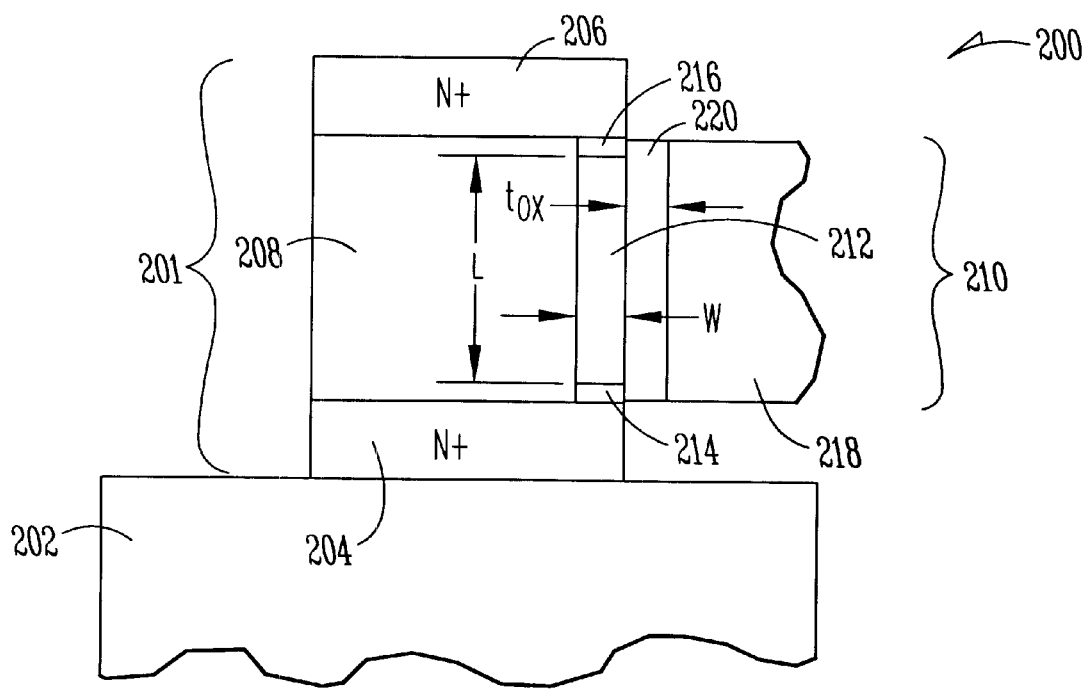
FIG. 2 is a diagram illustrating a vertical ultra thin body transistor formed along side of a pillar according to the teachings of the present invention.

FIG. 2 is a diagram illustrating an ultra thin single crystalline vertical transistor, or access FET 200 formed according to the teachings of the present invention. As shown in FIG. 2, access FET 200 includes a vertical ultra thin body transistor, or otherwise stated an ultra thin single crystalline vertical transistor. According to the teachings of the present invention, the structure of the access FET 200 includes a pillar 201 extending outwardly from a semiconductor substrate 202. The pillar includes a single crystalline first contact layer 204 and a second contact layer 206 vertically separated by an oxide layer 208. An ultra thin single crystalline vertical transistor 210 is formed along side of the pillar 201. The ultra thin single crystalline vertical transistor 210 includes an ultra thin single crystalline vertical body region 212 which separates an ultra thin single crystalline vertical first source/drain region 214 and an ultra thin single crystalline vertical second source/drain region 216. The ultra thin single crystalline vertical first source/drain region 214 is coupled to the first contact layer 204 and the ultra thin single crystalline vertical second source/drain region 216 is coupled to the second contact layer. A gate 218 is formed opposing the ultra thin single crystalline vertical body region 212 and is separated therefrom by a thin gate oxide layer 220.

According to embodiments of the present invention, the ultra thin single crystalline vertical transistor 210 includes a transistor having a vertical length of less than 100 nanometers and a horizontal width of less than 10 nanometers. Thus, in one embodiment, the ultra thin single crystalline vertical body region 212 includes a channel having a vertical length (L) of less than 100 nanometers. Also, the ultra thin single crystalline vertical body region 212 has a horizontal width (W) of less than 10 nanometers. And, the ultra thin single crystalline vertical first source/drain region 214 and an ultra thin single crystalline vertical second source/drain region 216 have a horizontal width of less than 10 nanometers. According to the teachings of the present invention, the ultra thin single crystalline vertical transistor 210 is formed from solid phase epitaxial growth.

As one of ordinary skill in the art will understand upon reading this disclosure, the ultra thin single crystalline vertical transistors with ultra thin bodies of the present invention provide a surface space charge region which scales down as other transistor dimensions scale down. This structure of the invention facilitates increasing density and design rule demands while suppressing short-channel effects such as drain-induced barrier lowering; threshold voltage roll off, and sub-threshold conduction.

An n-channel type transistor is shown in the embodiment of FIG. 2. However, one of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited.

Figure 3A:
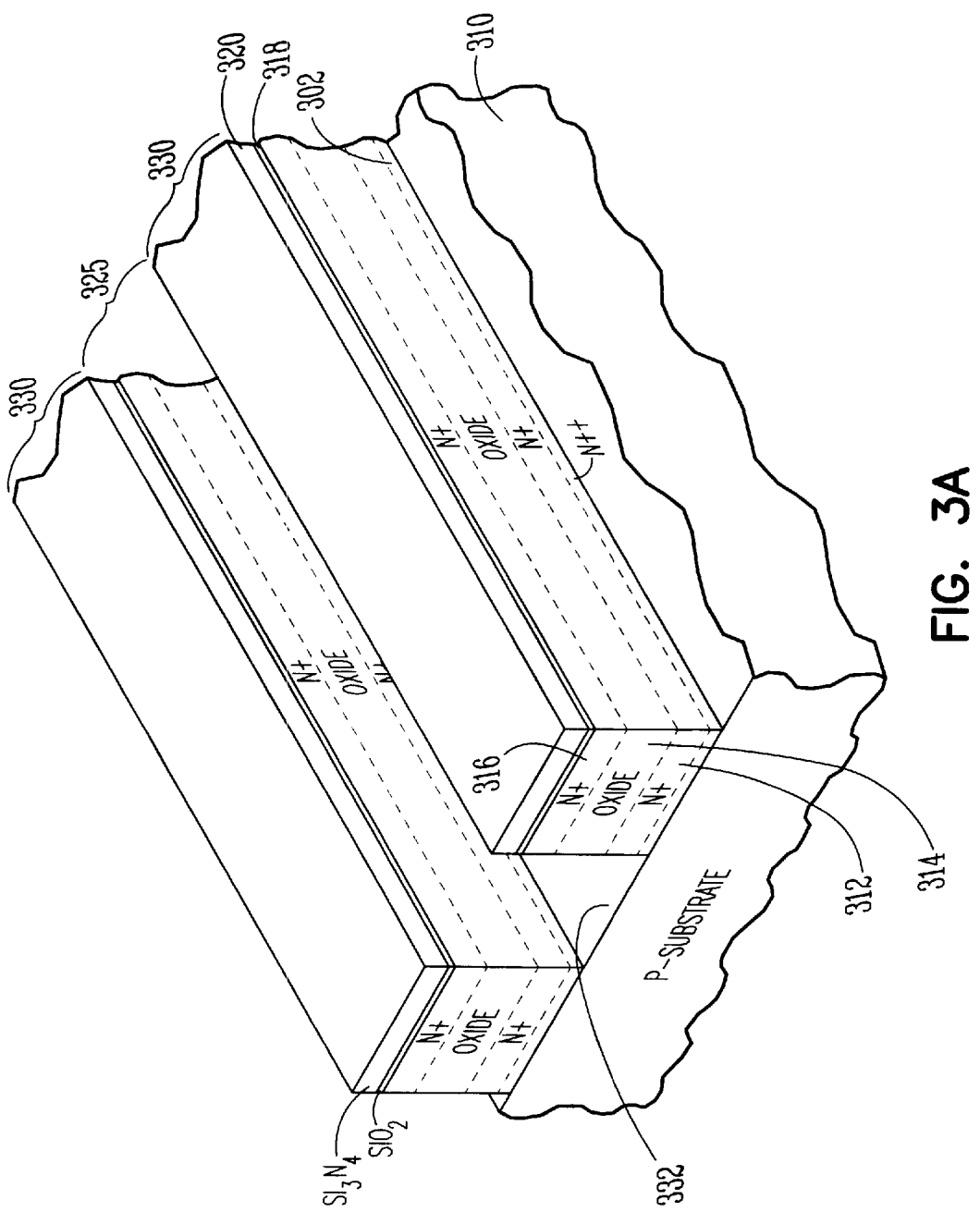
FIGS. 3A–3C illustrate an initial process sequence which for forming pillars along side of which vertical ultra thin body transistors can later be formed according to the teachings of the present invention.
Figure 3B:
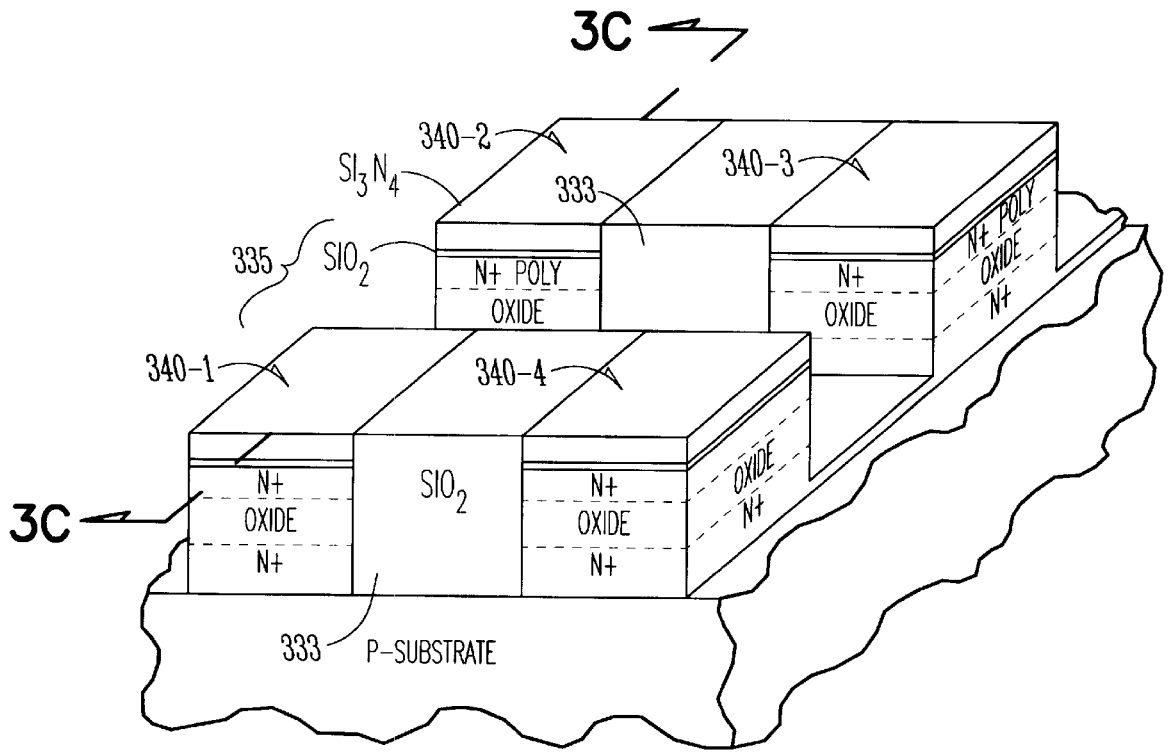
Figure 3C:
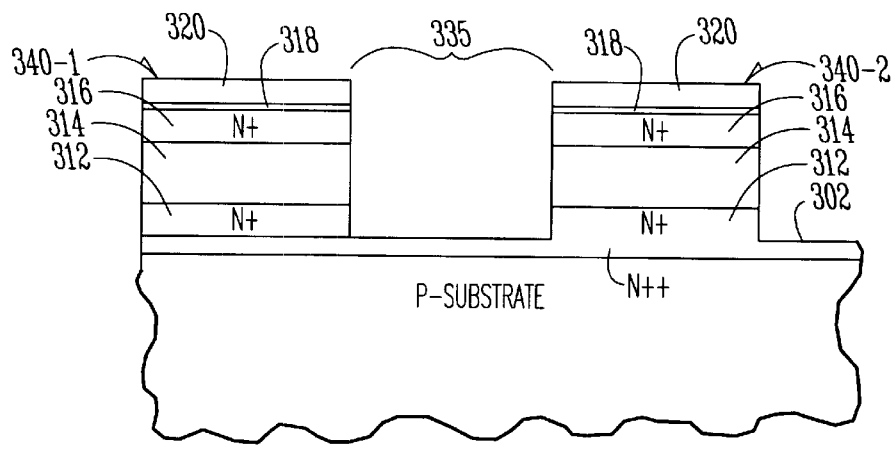

FIGS. 3A–3C illustrate an initial process sequence for forming pillars along side of which vertical ultra thin body transistors can later be formed as part of forming a programmable memory address and decode circuit according to the teachings of the present invention. The dimensions suggested are appropriate to a 0.1 μm cell dimension (CD) technology and may be scaled accordingly for other CD sizes. In the embodiment of FIG. 3A, a p-type bulk silicon substrate 310 starting material is used. An n++ and n+ silicon composite first contact layer 312 is formed on substrate 310, such as by ion-implantation, epitaxial growth, or a combination of such techniques to form a single crystalline first contact layer 312. According to the teachings of the present invention, the more heavily conductively doped lower portion of the first contact layer 312 also functions as the bit line 302. The thickness of the n++ portion of first contact layer 312 is that of the desired bit line 302 thickness, which can be approximately between 0.1 to 0.25 μm. The overall thickness of the first contact layer 312 can be approximately between 0.2 to 0.5 μm. An oxide layer 314 of approximately 100 nanometers (nm), 0.1 μm, thickness or less is formed on the first contact layer 312. In one embodiment, the oxide layer 314 can be formed by thermal oxide growth techniques. A second contact layer 316 of n+ silicon is formed on the oxide layer 314, using known techniques to form a polycrystalline second contact layer 316. The second contact layer 316 is formed to a thickness of 100 nm or less.

Next, a thin silicon dioxide layer (SiO$_2$) 318 of approximately 10 nm is deposited on the second contact layer 316. A thicker silicon nitride layer (Si$_3$N$_4$) 320 of approximately 100 nm in thickness is deposited on the thin silicon dioxide layer (SiO$_2$) 318 to form pad layers, e.g. layers 318 and 320. These pad layers 318 and 320 can be deposited using any suitable technique such as by chemical vapor deposition (CVD).

A photoresist is applied and selectively exposed to provide a mask for the directional etching of trenches 325, such as by reactive ion etching (RIE). The directional etching results in a plurality of column bars 330 containing the stack of nitride layer 320, pad oxide layer 318, second contact layer 316, oxide layer 314, and first contact layer 312. Trenches 325 are etched to a depth that is sufficient to reach the surface 332 of substrate 310, thereby providing separation between conductively doped bit lines 302. The photoresist is removed. Bars 330 are now oriented in the direction of bit lines 302, e.g. column direction. In one embodiment, bars 330 have a surface line width of approximately one micron or less. The width of each trench 325 can be approximately equal to the line width of bars 330. The structure is now as appears in FIG. 3A.

In FIG. 3B, isolation material 333, such as SiO$_2$ is deposited to fill the trenches 325. The working surface is then planarized, such as by chemical mechanical polishing/planarization (CMP). A second photoresist is applied and selectively exposed to provide a mask for the directional etching of trenches 335 orthogonal to the bit line 302 direction, e.g. row direction. Trenches 335 can be formed using any suitable technique such as by reactive ion etching (RIE). Trenches 335 are etched through the exposed SiO$_2$ and the exposed stack of nitride layer 320, pad oxide layer 318, second contact layer 316, oxide layer 314, and into the first contact layer 312 but only to a depth sufficient to leave the desired bit line 302 thickness, e.g. a remaining bit line thickness of typically 100 nm. The structure is now as appears in FIG. 3B having individually defined pillars 340-1, 340-2, 340-3, and 340-4.

FIG. 3C illustrates a cross sectional view of the structure shown in FIG. 3B taken along cut-line 3C—3C. FIG. 3C shows the continuous bit line 302 connecting adjacent pillars 340-1 and 340-2 in any given column. Trench 335 remains for the subsequent formation of floating gates and control gates, as described below, in between adjacent rows of the pillars, such as a row formed by pillars 340-1 and 340-4 and a row formed by pillars 340-2, and 340-3.

Figure 4A:
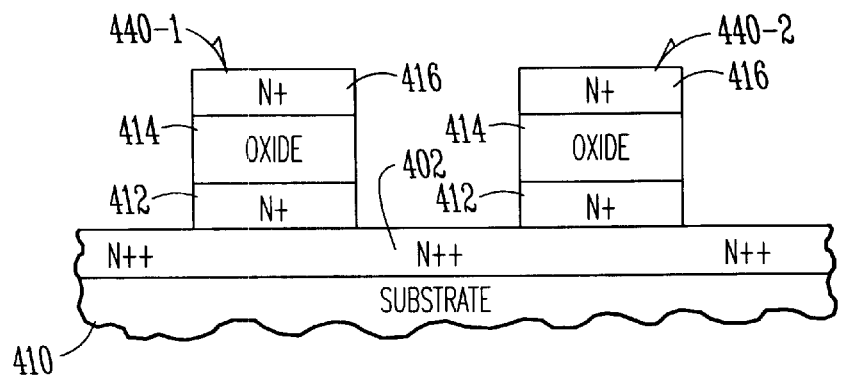
FIGS. 4A–4C illustrate that the above techniques described in connection with FIGS. 3A–3C can be implemented with a bulk CMOS technology or a silicon on insulator (SOI) technology.
Figure 4B:
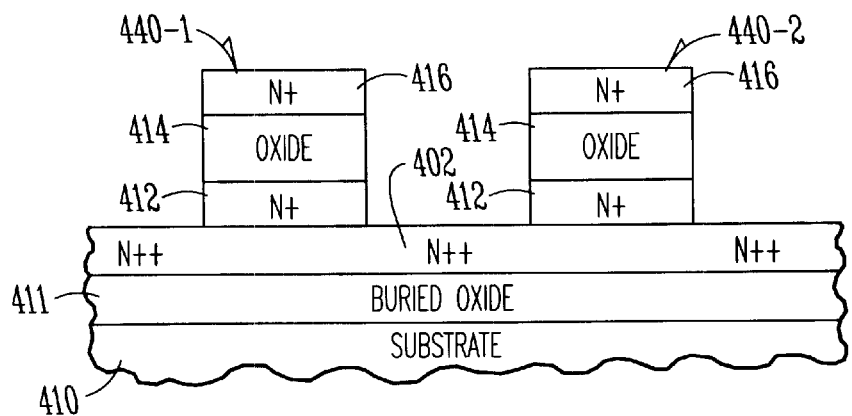
Figure 4C:
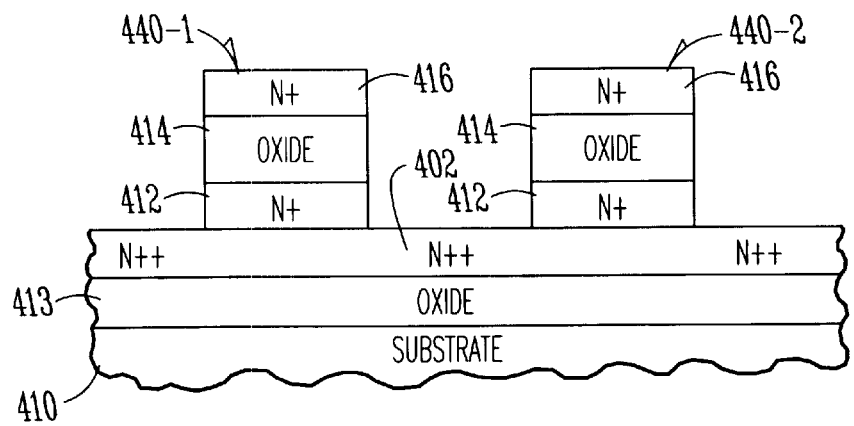

FIGS. 4A–4C illustrate that the above techniques described in connection with FIGS. 3A–3C can be implemented on a bulk CMOS technology substrate or a silicon on insulator (SOI) technology substrate. FIG. 4A represents the completed sequence of process steps shown in FIGS. 3A–3C, minus the pad layers, formed on a lightly doped p-type bulk silicon substrate 410. The structure shown in FIG. 4A is similar to the cross sectional view in FIG. 3C and shows a continuous bit line 402 with pillar stacks 440-1 and 440-2 formed thereon. The pillars 440-1 and 440-2 include an n+ first contact layer 412, an oxide layer 414 formed thereon, and a second n+ contact layer 416 formed on the oxide layer 414.

FIG. 4B represents the completed sequence of process steps shown in FIGS. 3A–3C, minus the pad layers, formed on a commercial SOI wafer, such as SIMOX. As shown in FIG. 4B, a buried oxide layer 411 is present on the surface of the substrate 410. The structure shown in FIG. 4B is also similar to the cross sectional view in FIG. 3C and shows a continuous bit line 402 with pillar stacks 440-1 and 440-2 formed thereon, only here the continuous bit line 402 is separated from the substrate 410 by the buried oxide layer 411. Again, the pillars 440-1 and 440-2 include an n+ first contact layer 412, an oxide layer 414 formed thereon, and a second n+ contact layer 416 formed on the oxide layer 414.

FIG. 4C represents the completed sequence of process steps shown in FIGS. 3A–3C, minus the pad layers, forming islands of silicon on an insulator, where the insulator 413 has been formed by oxide under cuts. Such a process includes the process described in more detail in U.S. Pat. No. 5,691,230, by Leonard Forbes, entitled "Technique for Producing Small Islands of Silicon on Insulator," issued Nov. 25, 1997, which is incorporated herein by reference. The structure shown in FIG. 4C is also similar to the cross sectional view in FIG. 3C and shows a continuous bit line 402 with pillar stacks 440-1 and 440-2 formed thereon, only here the continuous bit line 402 is separated from the substrate 410 by the insulator 413 which has been formed by oxide under cuts such as according to the process referenced above. Again, the pillars 440-1 and 440-2 include an n+ first contact layer 412, an oxide layer 414 formed thereon, and a second n+ contact layer 416 formed on the oxide layer 414. Thus, according to the teachings of the present invention, the sequence of process steps to form pillars, as shown in FIGS. 3A–3C, can include forming the same on at least three different types of substrates as shown in FIGS. 4A–4C.

Figure 5A:
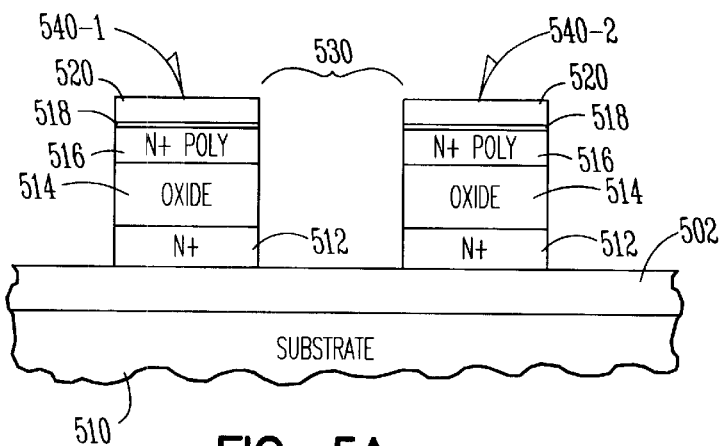
FIGS. 5A–5C illustrate a process sequence continuing from the pillar formation embodiments provided in FIGS. 3A–4C to form vertical ultra thin body transistors along side of the pillars.
Figure 5B:
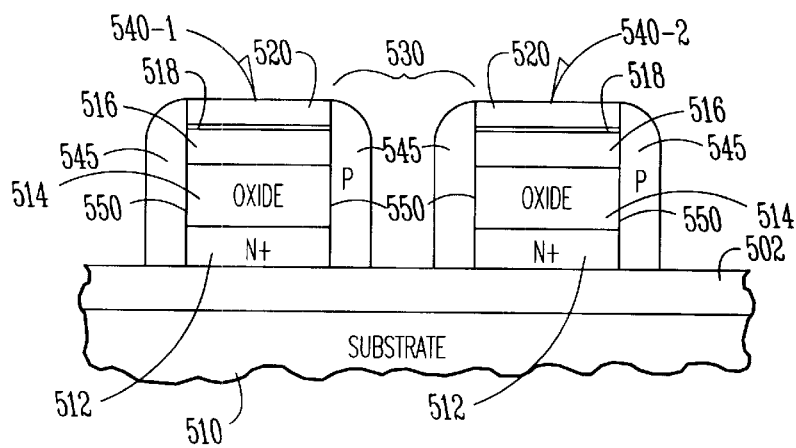
Figure 5C:
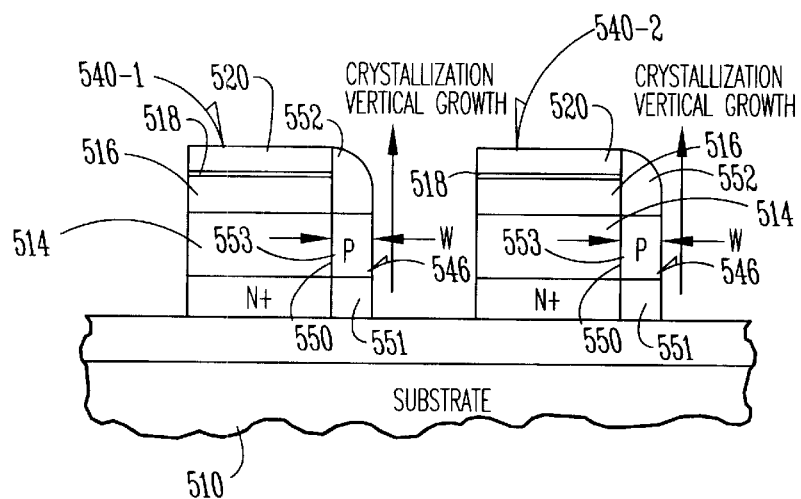

FIGS. 5A–5C illustrate a process sequence continuing from the pillar formation embodiments provided in FIGS. 3A–3C, and any of the substrates shown in FIGS. 4A–4C, to form vertical ultra thin body transistors along side of the pillars, such as pillars 340-1 and 340-2 in FIG. 3C. For purposes of illustration only, FIG. 5A illustrates an embodiment pillars 540-1 and 540-2 formed on a p-type substrate 510 and separated by a trench 530. Analogous to the description provided in connection FIGS. 5A–5C, FIG. 5A shows a first single crystalline n+ contact layer 512 a portion of which, in one embodiment, is integrally formed with an n++ bit line 502. An oxide layer region 514 is formed in pillars 540-1 and 540-2 on the first contact layer 512. A second n+ contact layer 516 is shown formed on the oxide layer region 514 in the pillars 540-1 and 540-2. And, pad layers of (SiO$_2$) 518 and (Si$_3$N$_4$) 520, respectively are shown formed on the second contact layer 516 in the pillars 540-1 and 540-2.

In FIG. 5B, a lightly doped p-type polysilicon layer 545 is deposited over the pillars 540-1 and 540-2 and directionally etched to leave the lightly doped p-type material 545 on the sidewalls 550 of the pillars 540-1 and 540-2. In one embodiment according to the teachings of the present invention, the lightly doped p-type polysilicon layer is directionally etched to leave the lightly doped p-type material 545 on the sidewalls 550 of the pillars 540-1 and 540-2 having a width (W), or horizontal thickness of 10 mn or less. The structure is now as shown in FIG. 5B.

The next sequence of process steps is described in connection with FIG. 5C. At this point another masking step, as the same has been described above, can be employed to isotropically etch the polysilicon 545 off of some of the sidewalls 550 and leave polysilicon 545 only on one sidewall of the pillars 540-1 and 540-2 if this is required by some particular configuration, e.g. forming ultra thin body transistors only on one side of pillars 540-1 and 540-2.

In FIG. 5C, the embodiment for forming the ultra thin single crystalline vertical transistors, or ultra thin body transistors, only on one side of pillars 540-1 and 540-2 is shown. In FIG. 5C, the wafer is heated at approximately 550 to 700 degrees Celsius. In this step, the polysilicon 545 will recrystallize and lateral epitaxial solid phase regrowth will occur vertically. As shown in FIG. 5C, the single crystalline silicon at the bottom of the pillars 540-1 and 540-2 will seed this crystal growth and an ultrathin single crystalline film 546 will form which can be used as the channel of an ultra thin single crystalline vertical MOSFET transistor. In the embodiment of FIG. 5C, where the film is left only on one side of the pillar, the crystallization will proceed vertically and into the n+ polysilicon second contact material/layer 516 on top of the pillars 540-1 and 540-2. If however, both sides of the pillars 540-1 and 540-2 are covered, the crystallization will leave a grain boundary near the center on top of the pillars 540-1 and 540-2. This embodiment is shown in FIG. 5D.

As shown in FIGS. 5C and 5D, drain and source regions, 551 and 552 respectively, will be formed in the ultrathin single crystalline film 546 along the sidewalls 550 of the pillars 540-1 and 540-2 in the annealing process by an out diffusion of the n+ doping from the first and the second contact layers, 512 and 516. In the annealing process, these portions of the ultrathin single crystalline film 546, now with the n+ dopant, will similarly recrystallize into single crystalline structure as the lateral epitaxial solid phase regrowth occurs vertically. The drain and source regions, 551 and 552, will be separated by a vertical single crystalline body region 552 formed of the p-type material. In one embodiment of the present invention, the vertical single crystalline body region will have a vertical length of less than 100 nm. The structure is now as shown in FIGS. 5C or 5D. As one of ordinary skill in the art will understand upon reading this disclosure. A conventional gate insulator can be grown or deposited on this ultrathin single crystalline film 546. And, either horizontal or vertical gate structures can be formed in trenches 530.

As one of ordinary skill in the art will understand upon reading this disclosure, drain and source regions, 551 and 552 respectively, have been formed in an ultrathin single crystalline film 546 to form a portion of the ultra thin single crystalline vertical transistors, or ultra thin body transistors, according to the teachings of the present invention. The ultrathin single crystalline film 546 now includes an ultra thin single crystalline vertical first source/drain region 551 coupled to the first contact layer 512 and an ultra thin single crystalline vertical second source/drain region 552 coupled to the second contact layer 516. An ultra thin p-type single crystalline vertical body region 553 remains along side of, or opposite, the oxide layer 514 and couples the first source/drain region 551 to the second source/drain region 552. In effect, the ultra thin p-type single crystalline vertical body region 553 separates the drain and source regions, 551 and 552 respectively, and can electrically couple the drain and source regions, 551 and 552, when a channel is formed therein by an applied potential. The drain and source regions, 551 and 552 respectively, and the ultra thin body region 553 are formed of single crystalline material by the lateral solid phase epitaxial regrowth which occurs in the annealing step.

The dimensions of the structure now include an ultra thin single crystalline body region 553 having a vertical length of less than 100 nm in which a channel having a vertical length of less than 100 nm can be formed. Also, the dimensions include drain and source regions, 551 and 552 respectively, having a junction depth defined by the horizontal thickness of the ultrathin single crystalline film 546, e.g. less than 10 nm. Thus, the invention has provided junction depths which are much less than the channel length of the device and which are scalable as design rules further shrink. Further, the invention has provided a structure for transistors with ultra thin bodies so that a surface space charge region in the body of the transistor scales down as other transistor dimensions scale down. In effect, the surface space charge region has been minimized by physically making the body region of the MOSFET ultra thin, e.g. 10 nm or less.

One of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited. From the process descriptions described above, the fabrication process can continue to form a number of different horizontal and vertical gate structure embodiments in the trenches 530 as described in connection with the Figures below.

Figure 6A:
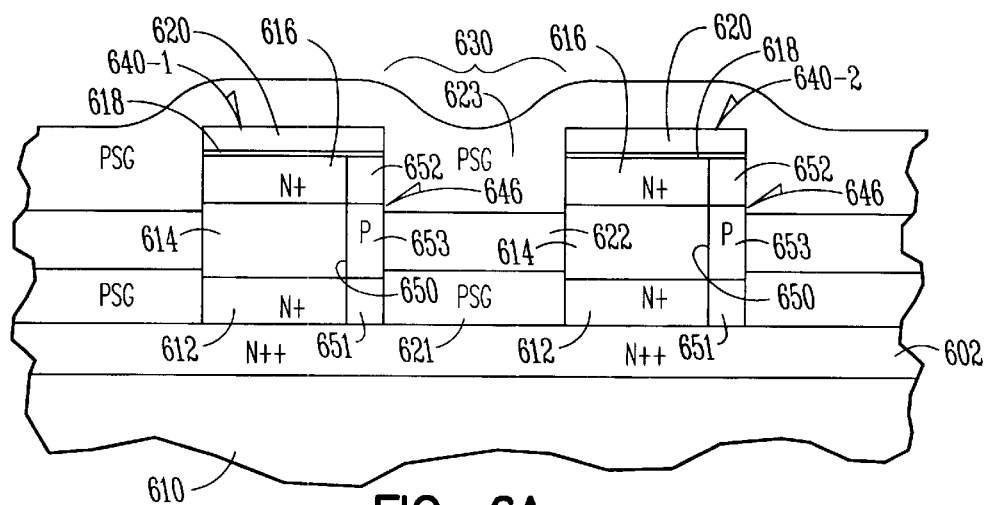
FIGS. 6A–6F illustrate a process sequence for forming a stacked horizontal floating gate and control gate structure embodiment according to the teachings of the present invention.

FIGS. 6A–6F illustrate a process sequence for forming a stacked horizontal floating gate and control gate structure embodiment, referred to herein as horizontal replacement gates, in connection with the present invention. The dimensions suggested in the following process steps are appropriate to a 0.1 micrometer CD technology and may be scaled accordingly for other CD sizes. FIG. 6A represents a structure similar to that shown in FIG. 5C. That is FIG. 6A shows an ultrathin single crystalline film 646 along the sidewalls 650 of pillars 640-1 and 640-2 in trenches 630. The ultrathin single crystalline film 646 at this point includes an ultra thin single crystalline vertical first source/drain region 651 coupled to a first contact layer 612 and an ultra thin single crystalline vertical second source/drain region 652 coupled to a second contact layer 616. An ultra thin p-type single crystalline vertical body region 653 is present along side of, or opposite, an oxide layer 614 and couples the first source/drain region 651 to the second source/drain region 652. According to the process embodiment shown in FIG. 6A an n+ doped oxide layer 621, or PSG layer as the same will be known and understood by one of ordinary skill in the art will understand, is deposited over the pillars 640-1 and 640-2 such as by a CVD technique. This n+ doped oxide layer 621 is then planarized to remove off of the top surface of the pillars 640-1 and 640-2. An etch process is performed to leave about 50 nm at the bottom of trench 630. Next, an undoped polysilicon layer 622 or undoped oxide layer 622 is deposited over the pillars 640-1 and 640-2 and CMP planarized to again remove from the top surface of the pillars 640-1 and 640-2. Then, the undoped polysilicon layer 622 is etched, such as by RIE to leave a thickness of 100 nm or less in the trench 630 along side of, or opposite oxide layer 614. Next, another n+ doped oxide layer 623, or PSG layer as the same will be known and understood by one of ordinary skill in the art will understand, is deposited over the pillars 640-1 and 640-2 such as by a CVD process. The structure is now as appears in FIG. 6A.

Figure 6B:
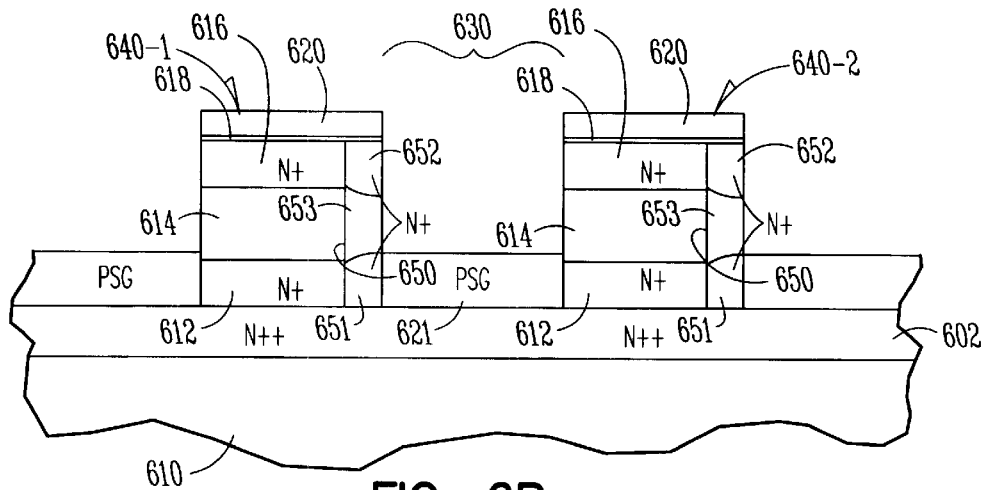

FIG. 6B illustrates the structure following the next sequence of fabrication steps. In FIG. 6B, a heat treatment is applied to diffuse the n-type dopant out of the PSG layers, e.g. 621 and 623 respectively, into the vertical ultrathin single crystalline film 646 to additionally form the drain and source regions, 651 and 652 respectively. Next, as shown in FIG. 6B, a selective etch is performed, as the same will be known and understood by one of ordinary skill in the art upon reading this disclosure, to remove the top PSG layer 623 and the undoped polysilicon layer 622, or oxide layer 622 in the trench 630. The structure is now as appears in FIG. 6B.

Figure 6C:
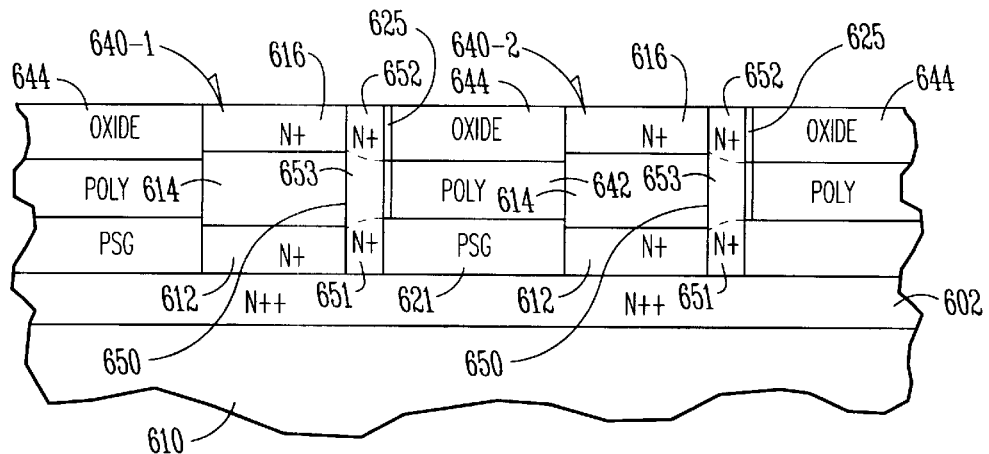

Next, in FIG. 6C, a thin gate oxide 625 is grown as the same will be known and understood by one of ordinary skill in the art, such as by thermal oxidation, for the ultra thin single crystalline vertical transistors, or ultra thin body transistors on the surface of the ultra thin single crystalline vertical body region 653. Next, doped n+ type polysilicon layer 642 can be deposited to form a gate 642 for the ultra thin single crystalline vertical transistors, or ultra thin body transistors. The structure then undergoes a CMP process to remove the doped n+ type polysilicon layer 642 from the top surface of the pillars 640-1 and 640-2 and RIE etched to form the desired thickness of the gate 642 for the ultra thin single crystalline vertical transistors, or ultra thin body transistors. In one embodiment, the doped n+ type polysilicon layer 642 is RIE etched to form an integrally formed, horizontally oriented floating gate 642 having a vertical side of less than 100 nanometers opposing the ultra thin single crystalline vertical body region 653. Next, an oxide layer 644 is deposited such as by a CVD process and planarized by a CMP process to fill trenches 630. An etch process is performed, as according to the techniques described above to strip the nitride layer 620 from the structure. This can include a phosphoric etch process using phosphoric acid. The structure is now as appears as is shown in FIG. 6C.

Figure 6D:
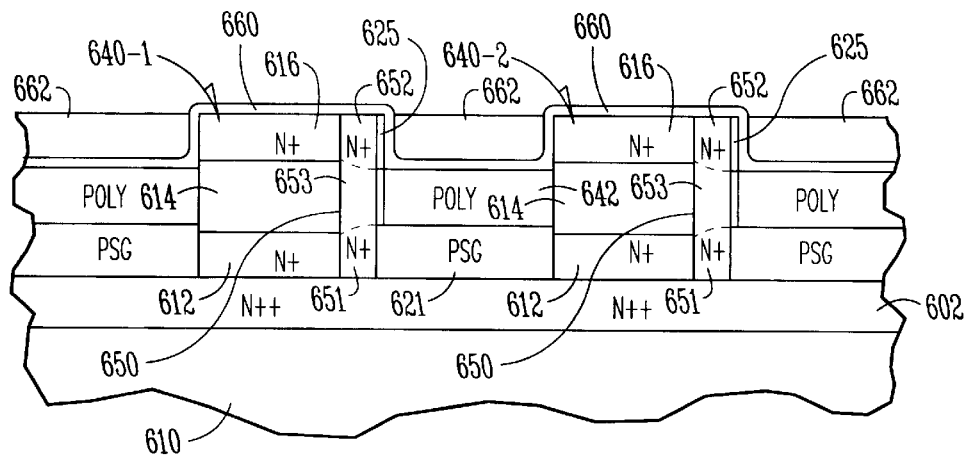

FIG. 6D illustrates the next sequence of fabrication steps. In FIG. 6D, the oxide layer 644 on the top of the horizontally oriented floating gate 642 is masked and etched, such as by RIE, to remove the oxide layer 644 in regions where the interpoly gate insulator or control gate insulator will be formed. Next, the interpoly gate insulator or control gate insulator 660 is formed. The interpoly gate insulator or control gate insulator 660 can be thermally grown oxide layer 660, or a deposited an oxynitride control gate insulator layer 660, as the same will be known and understood by one of ordinary skill in the art. The interpoly gate insulator or control gate insulator 660 is formed to a thickness of approximately 2 to 4 nanometers. Next, a polysilicon control gate 662 is formed. The polysilicon control gate can be formed by conventional photolithographic techniques for patterning and then depositing, such as by CVD, a polysilicon control gate line above the horizontally oriented floating gates 642. Another oxide layer can be deposited over the surface of the structure, such as by CVD to proceed with further fabrication steps.

Figure 6E:
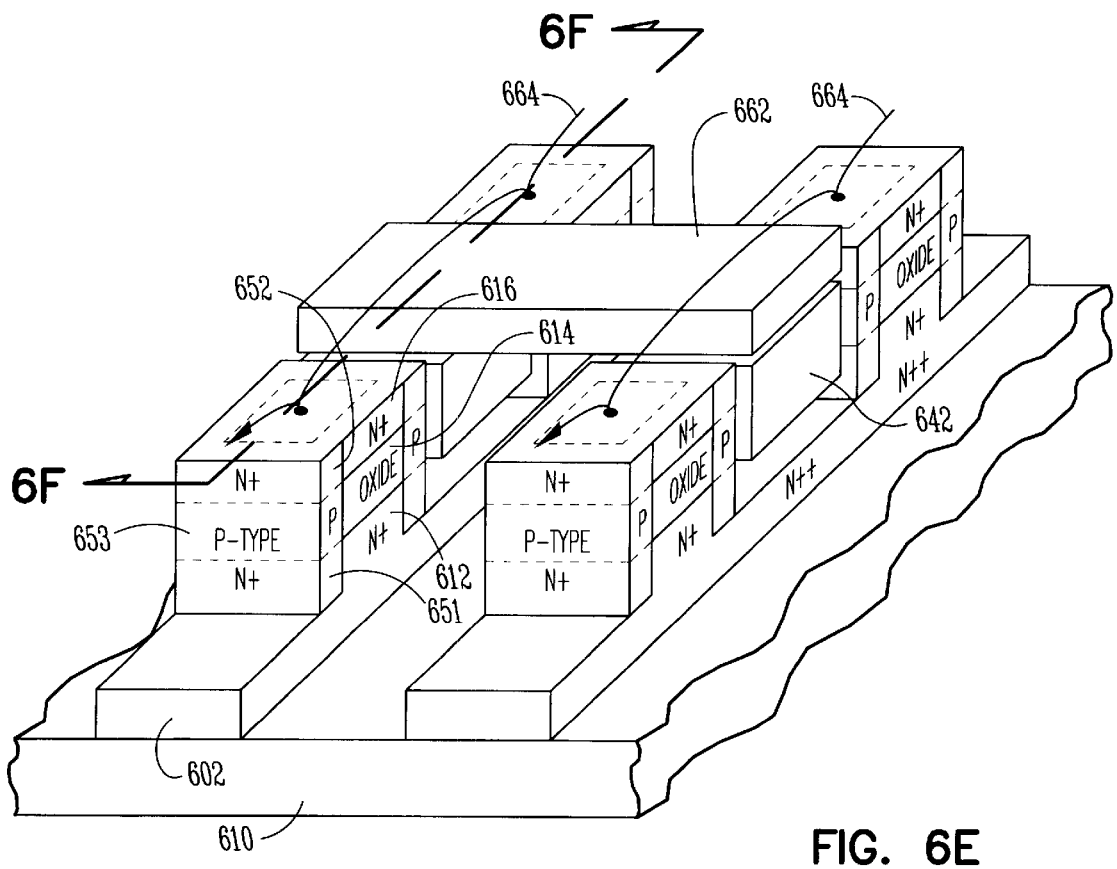
Figure 6F:
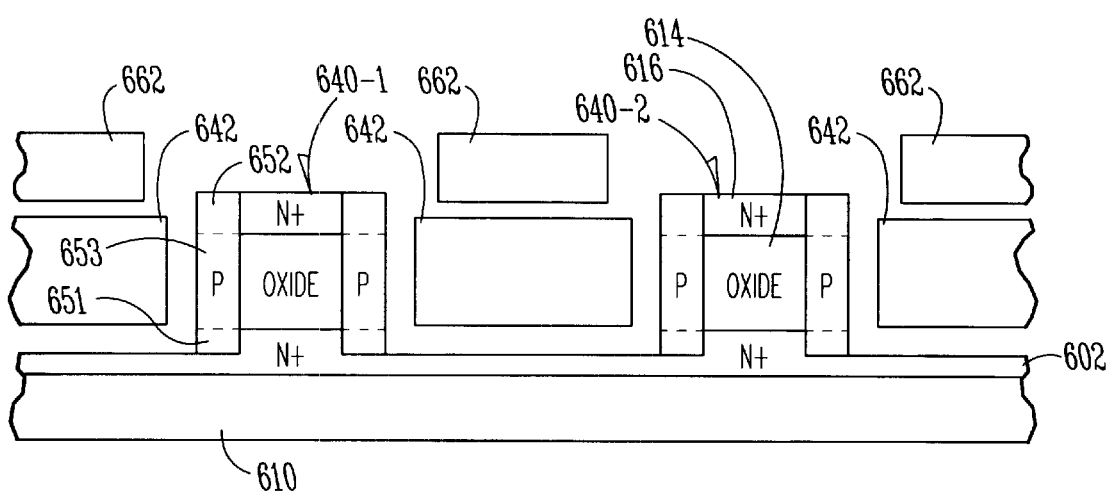

As one of ordinary skill in the art will understand upon reading this disclosure, contacts can be formed to the second contact layer 616 on top of the pillars 640-1 and 640-2 to continue with row or word address line 664 formation and standard BEOL processes. These methods can include conventional contact hole, terminal metal and inter level insulator steps to complete wiring of the cells and peripheral circuits. FIG. 6E is a perspective view of the completed structure. And, FIG. 6F is a cross sectional view of the same taken along cut line 6F—6F.

Alternatively, the above sequence of fabrication could have been followed minus the replacement gate steps. In this alternative embodiment, the process would have again begun with a structure similar to that shown in FIG. 5C. However, in FIG. 6A a conformal nitride layer would have been deposited to approximately 10 nm and then directionally etched to leave the nitride on the sidewalls of the pillars. A thermal oxide would be grown to insulate the exposed segments of the sourcelines 602, or y-address line bars 602. The nitride would then be stripped by an isotropic etch (e.g. phosphoric acid) and a thin tunneling, floating gate oxide of approximately 1 to 2 nm would be grown on the wall of the exposed ultrathin single crystalline film 646. An n-type polysilicon layer would be deposited to fill the trenches (e.g. >100 nm) and planarized (e.g. by CMP) and then recessed slightly below the level of the top of the ultrathin single crystalline film 646. The process would then simply continue with an etch process as described above to strip the nitride layer 620 from the structure. This can include a phosphoric etch process using phosphoric acid. From FIG. 6C forward the process would continue as described above to complete the structure.

Figure 7A:
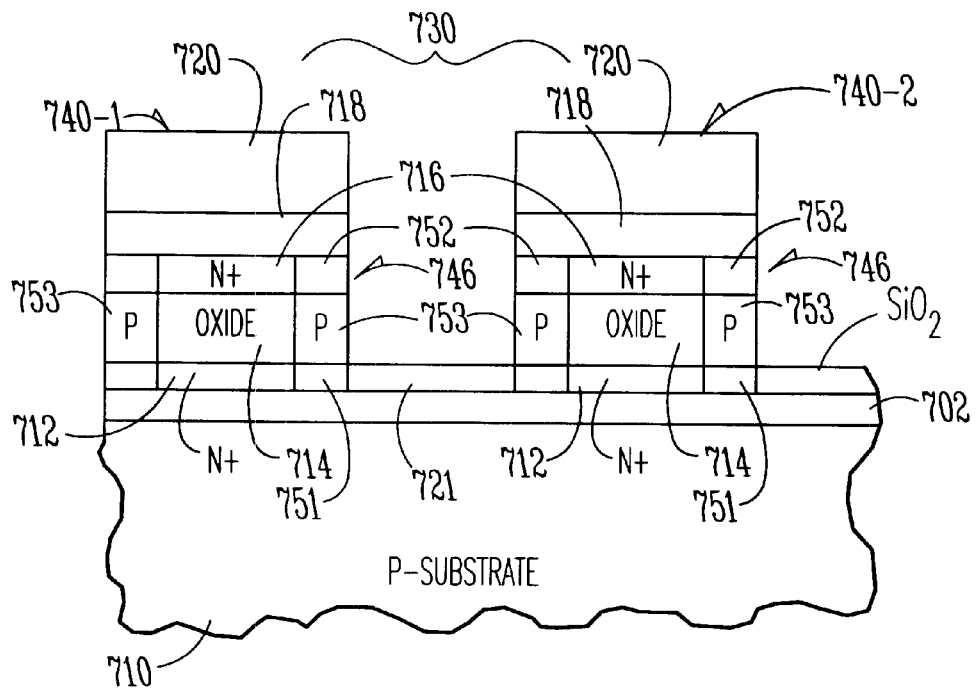
FIGS. 7A–7F illustrate a process description of one embodiment by which vertical floating gates and vertical control gates can be formed alongside vertical ultra-thin transistor body structures according to the teachings of the present invention.

FIGS. 7A–7E illustrate a process description of one embodiment by which vertical floating gates and vertical control gates can be formed alongside vertical ultra-thin transistor body structures. These structures can be achieved by someone skilled in the art of integrated circuit fabrication upon reading this disclosure. The dimensions suggested in the following process steps are appropriate to a 0.1 µm CD technology and may be scaled accordingly for other CD sizes. FIG. 7A represents a structure similar to that shown in FIG. 5C. That is FIG. 7A shows an ultrathin single crystalline film 746 along the sidewalls of pillars 740-1 and 740-2 in trenches 730. The ultrathin single crystalline film 746 at this point includes an ultra thin single crystalline vertical first source/drain region 751 coupled to a first contact layer 712 and an ultra thin single crystalline vertical second source/drain region 752 coupled to a second contact layer 716. An ultra thin p-type single crystalline vertical body region 753 is present along side of, or opposite, an oxide layer 714 and couples the first source/drain region 751 to the second source/drain region 752. According to the process embodiment shown in FIG. 7A, a conformal nitride layer of approximately 10 nm is deposited, such as by CVD, and directionally etched to leave only on the sidewalls of the pillars 740-1 and 740-2. An oxide layer 721 is then grown, such as by thermal oxidation, to a thickness of approximately 20 nm in order to insulate the exposed bit line bars 702. The conformal nitride layer on the sidewalls of the pillars 740-1 and 740-2 prevents oxidation along the ultrathin single crystalline film 746. The nitride layer is then stripped, using conventional stripping processes as the same will be known and understood by one of ordinary skill in the art. The structure is now as appears in FIG. 7A.

Figure 7B:
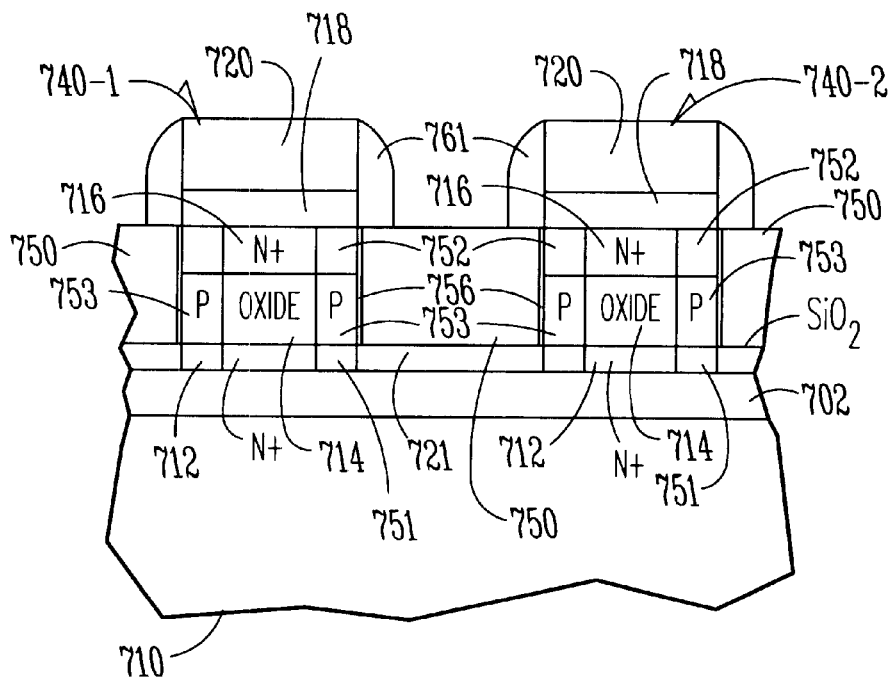

As shown in FIG. 7B, a thin tunneling oxide 756 is thermally grown on the sidewalls of the exposed ultrathin single crystalline film 746. The thin tunneling oxide 756 is grown to a thickness of approximately 1 to 2 nm. An n+ doped polysilicon material or suitable metal 750 is deposited, such as by CVD, to fill the trenches to a thickness of approximately 40 nm or less. The n+ doped polysilicon material 750 is then planarized, such as by CMP, and recessed, such as by RIE, to a height slightly below a top level of the ultrathin single crystalline film 746. A nitride layer 761 is then deposited, such as by CVD, to a thickness of approximately 20 nm for spacer formation and directionally etched to leave on the sidewalls of the thick oxide and nitride pad layers, 718 and 720 respectively. The structure is now as shown in FIG. 7B.

Figure 7C:
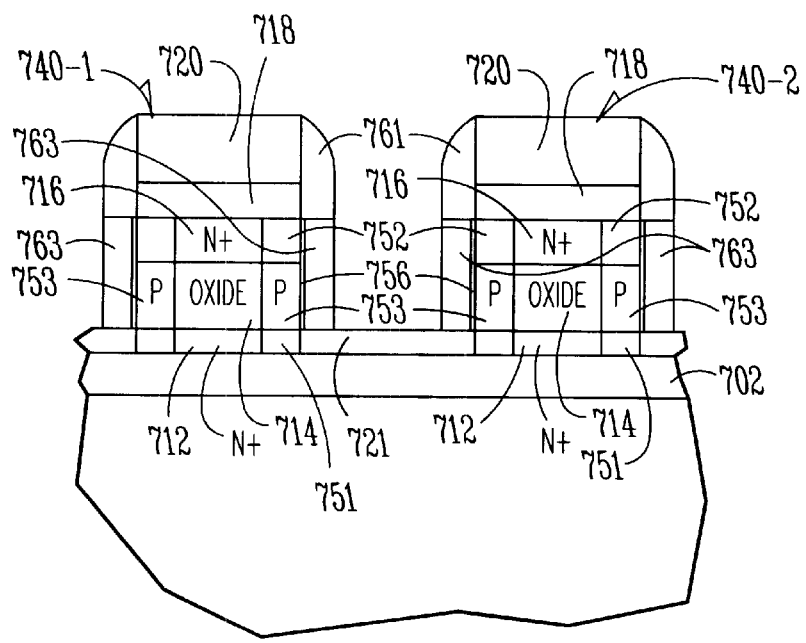

FIG. 7C illustrates the structure following the next sequence of processing steps. In FIG. 7C, the nitride spacers 761 are used as a mask and the exposed oxide in between columns of pillars, e.g. oxide 333 in FIG. 3B, is selectively etched between the sourcelines 702 to a depth approximately level with the oxide 721 on the sourcelines/y-address lines 702. Next, again using the nitride spacers 761 as a mask, the exposed n+ doped polysilicon material 750 is selectively etched stopping on the oxide layer 721 on the sourcelines/y-address lines 702 thus creating a pair of vertically oriented floating gates 763 in trench 730. The structure is now as appears in FIG. 7C.

Figure 7D:
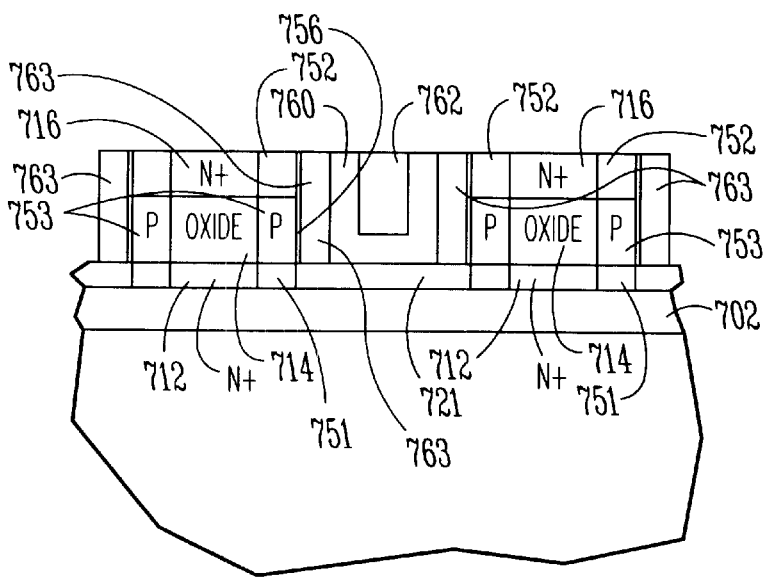

FIG. 7D illustrates the next sequence in this embodiment of the fabrication process. In FIG. 7D, the interpoly gate insulator or control gate insulator 760 is formed in the trench 730 covering the vertically oriented floating gates 763. The interpoly gate insulator or control gate insulator 760 can be thermally grown oxide layer 760, or a deposited an oxynitride control gate insulator layer 760, as the same will be known and understood by one of ordinary skill in the art. The interpoly gate insulator or control gate insulator 760 is formed to a thickness of approximately 7 to 15 nanometers.

An n+ doped polysilicon material or suitable gate material 762 is deposited, such as by CVD, to fill the trenches, or gate through troughs 730 to a thickness of approximately 100 nm. The n+ doped polysilicon material 762 is then planarized, such as by CMP, stopping on the thick nitride pad layer 720. The n+ doped polysilicon material 762 is then recessed, such as by RIE, to the approximately a top level of the ultrathin single crystalline film 746. Next, the nitride pad layer 720 is removed from the pillars 740-1 and 740-2. The nitride pad layer can be removed using a phosphoric etch or other suitable techniques. An oxide 775 is then deposited over the structure, such as by CVD, to cover the surface. The structure is now as appears in FIG. 7D.

Figure 7E:
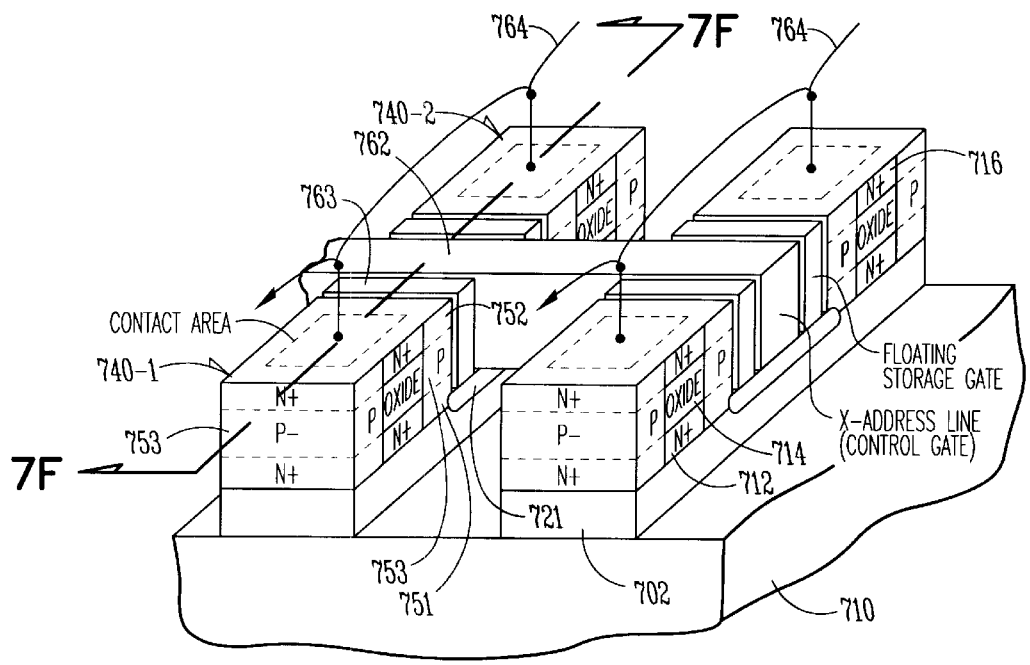
Figure 7F:
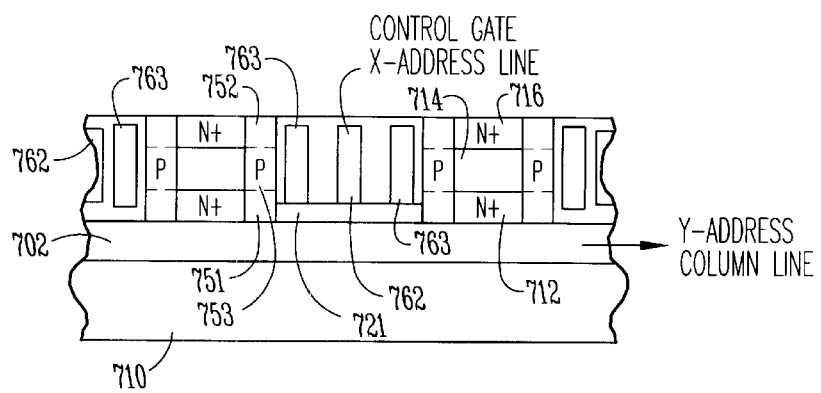

As one of ordinary skill in the art will understand upon reading this disclosure, contacts can be formed to the second contact layer 716 on top of the pillars 740-1 and 740-2 to continue with row or word address line 764 formation and standard BEOL processes. These methods can include conventional contact hole, terminal metal and inter level insulator steps to complete wiring of the cells and peripheral circuits. FIG. 7E is a perspective view of the completed structure. And, FIG. 7F is a cross sectional view of the same taken along cut line 7F—7F.

Figure 8A:
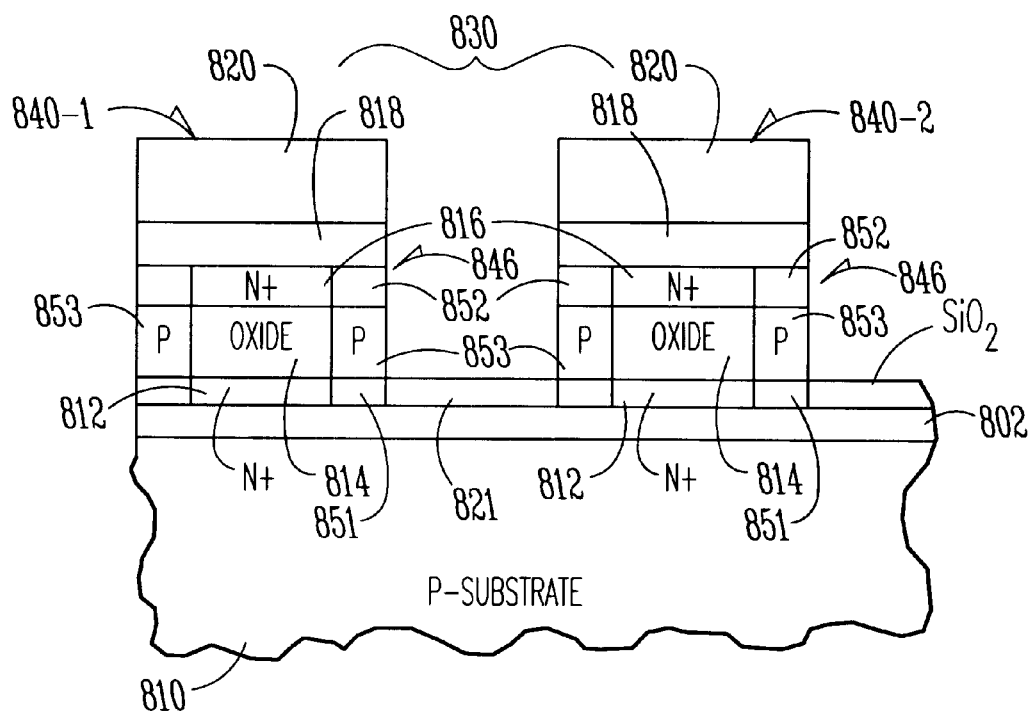
FIGS. 8A–8E illustrate a process description of one embodiment by which vertical floating gates can be formed alongside vertical ultra-thin transistor body structures and a horizontal oriented control gate can be formed above the vertically oriented floating gates according to the teachings of the present invention.

FIGS. 8A–8E illustrate a process description of one embodiment by which vertical floating gates can be formed alongside vertical ultra-thin transistor body structures and a horizontal oriented control gate can be formed above the vertically oriented floating gates. These structures can be achieved by someone skilled in the art of integrated circuit fabrication upon reading this disclosure. The dimensions suggested in the following process steps are appropriate to a 0.1 µm CD technology and may be scaled accordingly for other CD sizes. FIG. 8A represents a structure similar to that shown in FIG. 5C. That is FIG. 8A shows an ultrathin single crystalline film 846 along the sidewalls of pillars 840-1 and 840-2 in trenches 830. The ultrathin single crystalline film 846 at this point includes an ultra thin single crystalline vertical first source/drain region 851 coupled to a first contact layer 812 and an ultra thin single crystalline vertical second source/drain region 852 coupled to a second contact layer 816. An ultra thin p-type single crystalline vertical body region 853 is present along side of, or opposite, an oxide layer 814 and couples the first source/drain region 851 to the second source/drain region 852. According to the process embodiment shown in FIG. 8A, a conformal nitride layer of approximately 10 mn is deposited, such as by CVD, and directionally etched to leave only on the sidewalls of the pillars 840-1 and 840-2. An oxide layer 821 is then grown, such as by thermal oxidation, to a thickness of approximately 20 nm in order to insulate the exposed bit line bars 802. The conformal nitride layer on the sidewalls of the pillars 840-1 and 840-2 prevents oxidation along the ultrathin single crystalline film 846. The nitride layer is then stripped, using conventional stripping processes as the same will be known and understood by one of ordinary skill in the art. The structure is now as appears in FIG. 8A.

Figure 8B:
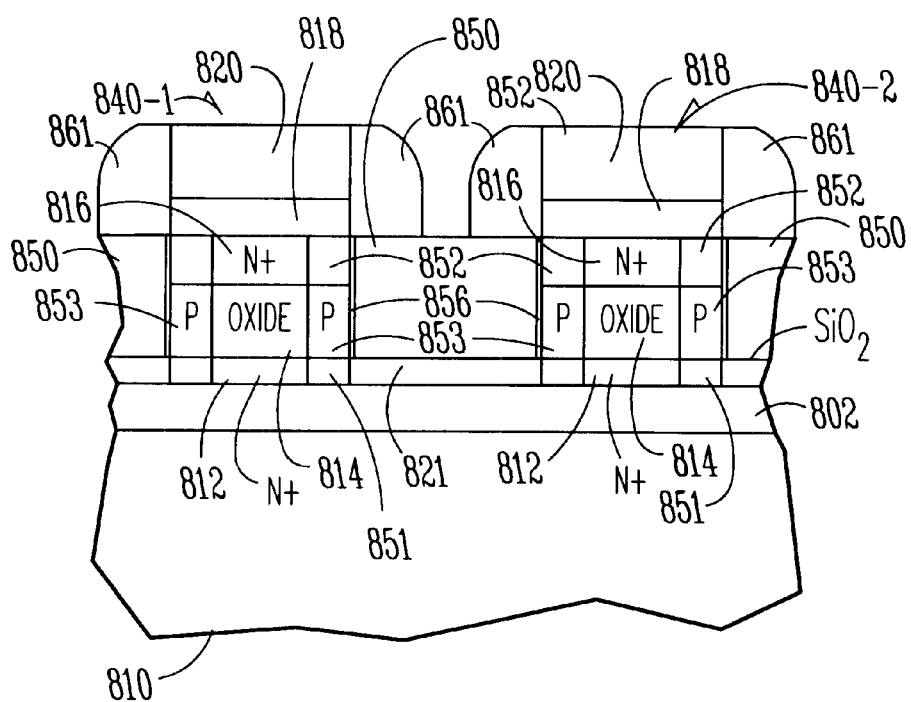

As shown in FIG. 8B, a thin tunneling oxide 856 is thermally grown on the sidewalls of the exposed ultrathin single crystalline film 846. The thin tunneling oxide 856 is grown to a thickness of approximately 1 to 2 nm. An n+ doped polysilicon material or suitable metal 850 is deposited, such as by CVD, to fill the trench to a thickness of approximately 40 nm or less. The n+ doped polysilicon material 850 is then planarized, such as by CMP, and recessed, such as by RIE, to a height slightly below a top level of the ultrathin single crystalline film 846. A nitride layer 861 is then deposited, such as by CVD, to a thickness of approximately 50 nm for spacer formation and directionally etched to leave on the sidewalls of the thick oxide and nitride pad layers, 818 and 820 respectively. The structure is now as shown in FIG. 8B.

Figure 8C:
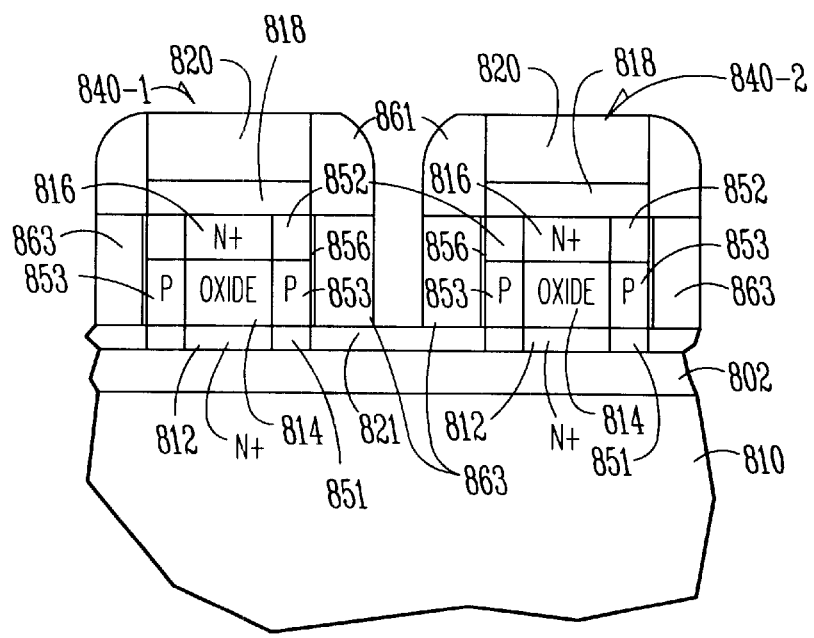

FIG. 8C illustrates the structure following the next sequence of processing steps. In FIG. 8C, the nitride spacers 861 are used as a mask and the exposed oxide in between columns of pillars, e.g. oxide 333 in FIG. 3B, is selectively etched between the sourcelines 802 to a depth approximately level with the oxide 821 on the sourcelines/y-address lines 802. Next, again using the nitride spacers 861 as a mask, the exposed n+ doped polysilicon material 850 is selectively etched stopping on the oxide layer 821 on the sourcelines/y-address lines 802 thus creating a pair of vertically oriented floating gates 863 in trench 830. The structure is now as appears in FIG. 8C.

Figure 8D:
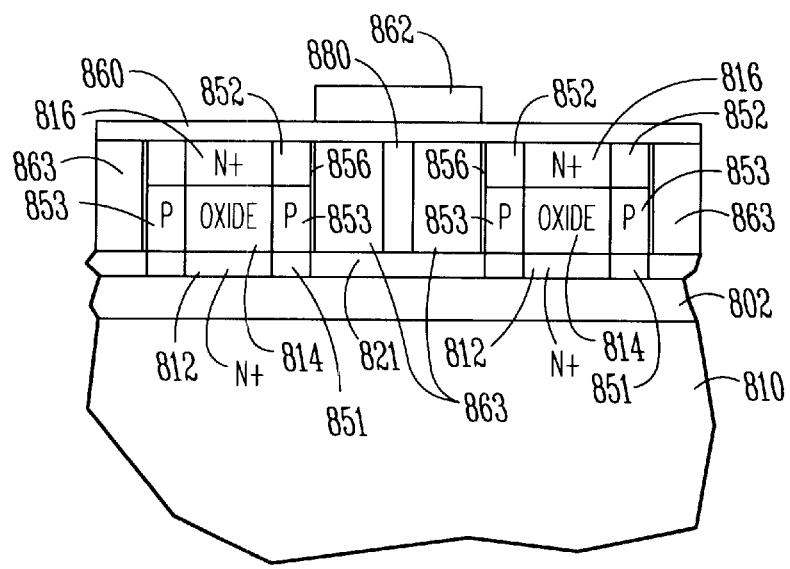

FIG. 8D illustrates the next sequence in this embodiment of the fabrication process. In FIG. 8D, an oxide layer 880 is deposited in the trench 830 covering the vertically oriented floating gates 863. The oxide layer 880 is planarized, such as by CMP, stopping on the thick nitride pad layer 820. The oxide layer 880 is then recessed, such as by RIE, to the approximately a top level of the ultrathin single crystalline film 846. Next, the nitride pad layer 820 is removed from the pillars 840-1 and 840-2 and the nitride spacers 861 are also removed. The nitride pad layer 820 and nitride spacers 861 can be removed using a phosphoric etch or other suitable techniques. An interpoly gate insulator or control gate insulator 860 is formed over the oxide layer 880 in the trench 830 and over the vertically oriented floating gates 863. The interpoly gate insulator or control gate insulator 860 can be thermally grown oxide layer 860, or a deposited an oxynitride control gate insulator layer 860, as the same will be known and understood by one of ordinary skill in the art. The interpoly gate insulator or control gate insulator 860 is formed to a thickness of approximately 2 to 4 nanometers on the vertically oriented floating gates 863. An n+ doped polysilicon material or suitable gate material 862 is deposited, such as by CVD, over the interpoly gate insulator or control gate insulator 860 and above the vertically oriented floating gates 863 to a thickness of approximately 50 nm. The n+ doped polysilicon material 862 is then patterned, as the same will be known and understood by one of ordinary skill in the art, into horizontal bars or control gate lines. An oxide 875 is can then deposited, such as by CVD to cover the surface. The structure is now as appears in FIG. 8D.

Figure 8E:
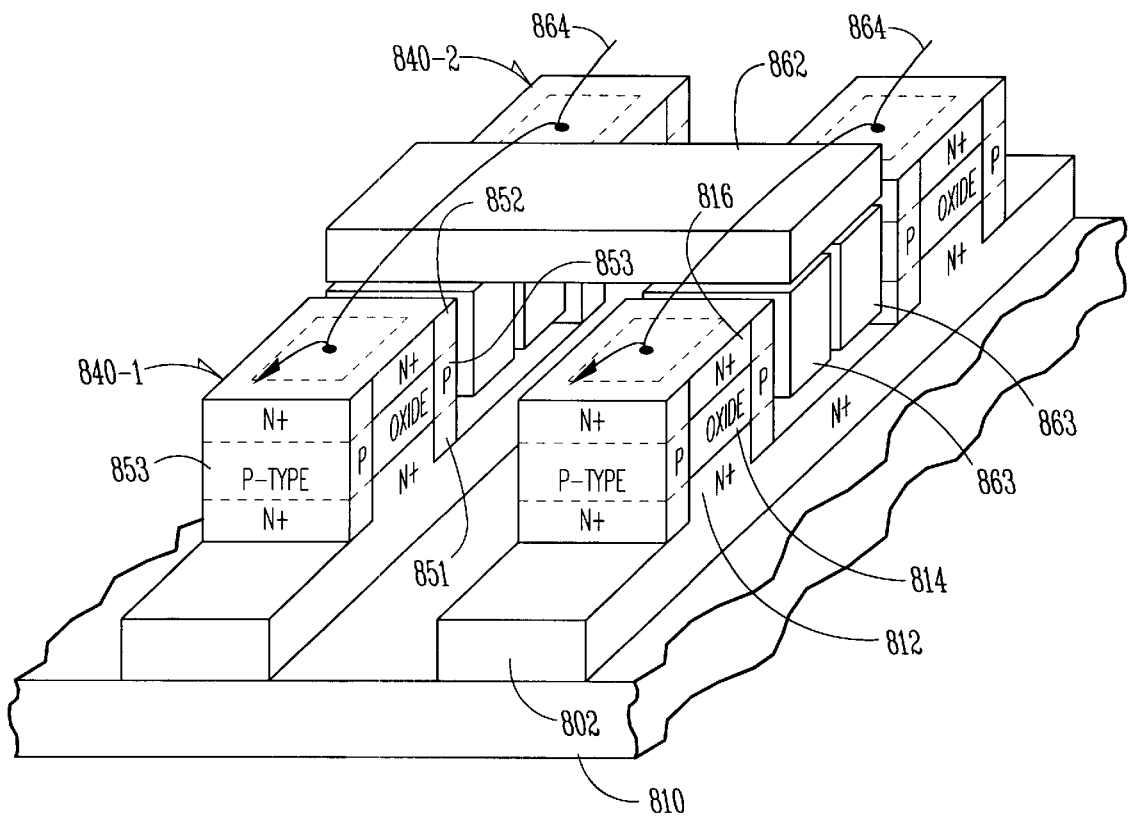

As one of ordinary skill in the art will understand upon reading this disclosure, contacts can be formed to the second contact layer 816 on top of the pillars 840-1 and 840-2 to continue with row or word address line 864 formation and standard BEOL processes. These methods can include conventional contact hole, terminal metal and inter level insulator steps to complete wiring of the cells and peripheral circuits. FIG. 8E is a perspective view of the completed structure.

Figure 9:
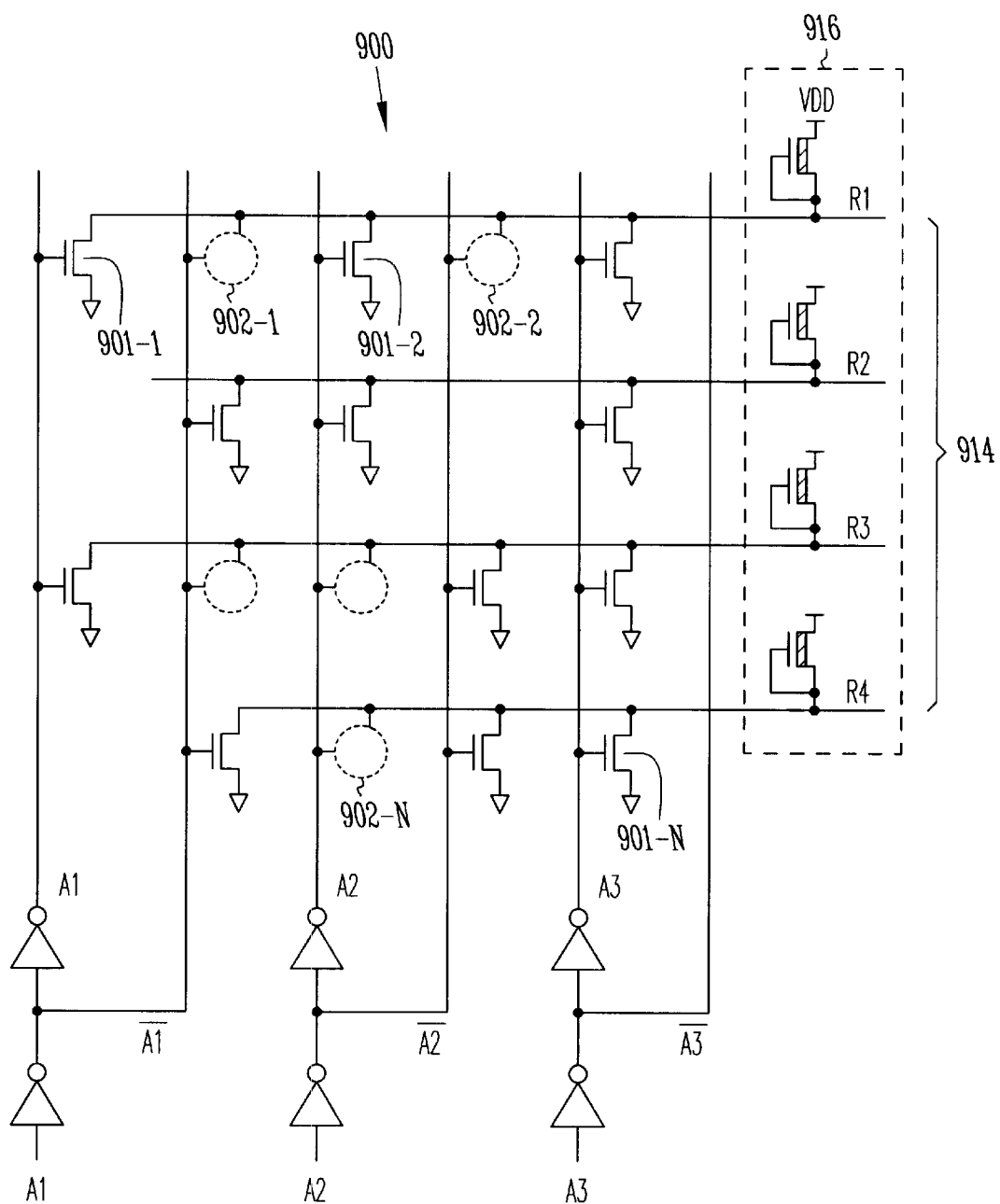
FIG. 9 shows a conventional NOR decode array for memory circuits according to the teachings of the prior art.

FIG. 9 shows a conventional NOR decode array for memory circuits. The address lines are A1 through A3 and inverse address lines, A1 through A3. The conventional NOR decode array is programmable at the gate mask level by either fabricating a thin oxide gate transistor, e.g. transistors 901-1, 901-2, . . . , 901-N, at the intersection of lines in the array or not fabricating a thin oxide gate transistor, e.g. missing thin oxide transistors, 902-1, 902-2, . . . , 902-N, at such an intersection. As one of ordinary skill in the art will understand upon reading this disclosure, the same technique is conventionally used to form other types of decode arrays not shown. As shown in FIG. 9, a number of depletion mode NMOS transistors, 916, are used as load devices.

In this embodiment, each of the row lines 914 acts as a NOR gate for the address lines A1 through A3 and inverse address lines, A1 through A3 that are connected to the row lines 914 through the thin oxide gate transistor, e.g. transistors 901-1, 901-2, . . . , 901-N, of the array. That is, row line R1 is maintained at a high potential, +VDD, in the positive logic NMOS decode array shown in FIG. 9A, unless one or more of the thin oxide gate transistor, e.g. transistors 901-1, 901-2, . . . , 901-N, that are coupled to row line R1 are turned on by a high logic level signal, +VDD, on one of the address lines A1 through A3 or inverse address lines, A1 through A3. When a transistor gate address is activated, by the high logic level signal, +VDD, through address lines A1 through A3 or inverse address lines, A1 through A3, each thin oxide gate transistor, e.g. transistors 901-1, 901-2, . . . , 901-N, conducts, or is turned "on." This conduction of the thin oxide gate transistor, e.g. transistors 901-1, 901-2, . . . , 901-N, performs the NOR positive logic circuit function, an inversion of the OR circuit function results from inversion of data onto the row lines 914 through the thin oxide gate transistor, e.g. transistors 901-1, 901-2, . . . , 901-N, of the array, in order to output a low logic level signal on the row lines 914. Thus, a particular row line 914 is addressed when none of the thin oxide gate transistor, e.g. transistors 901-1, 901-2, . . . , 901-N, coupled to that row line 914 are turned "on."

Again, the incoming address on each line is inverted and the combination of the original address and inverted or complemented values used to drive the gates of transistors in the decode array 900. The transistors 901-1, 901-2, . . . , 901-N in the array 900 are enhancement mode NMOS devices and depletion mode NMOS transistors are used as load devices 916. All voltages are positive in a simple NMOS circuit. This is a positive logic NOR decode array, the logic one state, "1" is the most positive voltage, +VDD, and the logic level zero, "0" is the least positive voltage or ground.

The transistors used in FIG. 9 are NMOS driver transistors with a depletion mode NMOS load technology. The load device or NMOS load transistor is a depletion mode or normally "on" transistor which acts as a constant current source during the pull up switching transient thus providing high switching speed. The driver transistor is an enhancement mode NMOS transistor which is normally "off" with zero gate bias.

Figure 10:
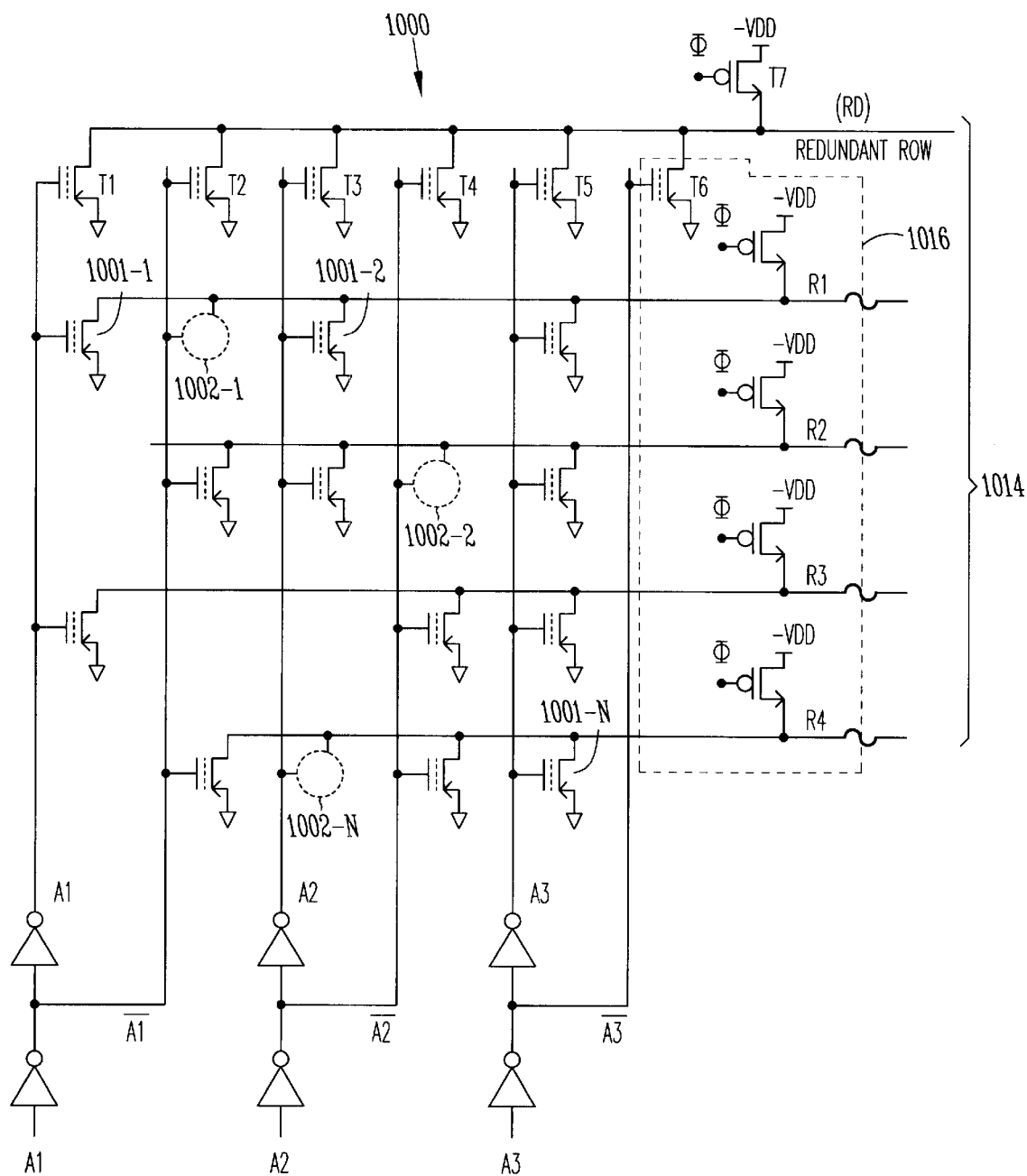
FIG. 10 is a schematic diagram illustrating an embodiment of a decode circuit, or memory address decoder, according to the teachings of the present invention.

FIG. 10 is a schematic diagram illustrating one embodiment of a decode circuit, or memory address decoder, 1000 according to the teachings of the present invention. Analogous to FIG. 9, the address lines are A1 through A3 and inverse address lines, A1 through A3. As shown in FIG. 10, the decode circuit 1000 is programmable at the gate mask level by either fabricating a driver transistor, or logic cell, e.g. transistors 1001-1, 1001-2, . . . , 1001-N, at the intersection of lines in the array or not fabricating a driver transistor, or logic cell, e.g. missing floating gate driver transistors 1002-1, 1002-2, . . . , 1002-N, at such an intersection. In one embodiment according to the teachings of the present invention, fabricating a driver transistor, e.g. transistors 1001-1, 1001-2, . . . , 1001-N, at the intersection of lines in the array includes fabricating the floating gate driver transistor according to the embodiments discussed and described in detail in connection with FIGS. 3A–8E. In one embodiment of the present invention, as shown in FIG. 10, a number of p-channel metal oxide semiconductor (PMOS) load transistors, 1016, are used as load devices and are coupled to the output lines, or row lines, 1014, of the decode circuit 1000.

The incoming address on each address line A1 through A3 is inverted and the combination of the original address on each address line A1 through A3 and inverted or complemented values on inverse address lines, A1 through A3, used to drive the gates of transistors 1001-1, 1001-2, . . . , 1001-N in the decode array 1000. The floating gate driver transistors, or logic cells, e.g. transistors 1001-1, 1001-2, . . . , 1001-N in the decode array 1000 are n-channel floating gate driver transistors.

In FIG. 10, each of the row lines 1014 acts as a NOR gate for the address lines A1 through A3 and inverse address lines, A1 through A3 that are connected to the row lines 1014 through the floating gate driver transistors, or logic cells, e.g. transistors 1001-1, 1001-2, . . . , 1001-N, of the array 1000. That is, row line R1 is maintained at a high potential VDD, or logic "1" unless one or more of the floating gate driver transistors, or logic cells, e.g. transistors 1001-1, 1001-2, . . . , 1001-N, that are coupled to row line R1 are turned on by a high logic level signal, VDD, on one of the address lines A1 through A3 or inverse address lines, A1 through A3. In the decode circuit 1000 configuration shown in FIG. 10, a logic "1", or VDD, on one of the address lines A1 through A3 or inverse address lines, A1 through A3, is required in order to turn on one of the n-channel floating gate driver transistors, or logic cells, e.g. transistors 1001-1, 1001-2, . . . , 1001-N, coupled to row line R1. As one of ordinary skill in the art will understand upon reading this disclosure, the floating gate driver transistors, or logic cells, e.g. transistors 1001-1, 1001-2, . . . , 1001-N, can be programmed to have two different conductivity states depending upon whether electrons are stored on the vertical floating gate. When a charge is stored on the vertical floating gate for any one of these floating gate driver transistors, 1001-1, 1001-2, . . . , 1001-N, the floating gate transistor is effectively removed from the programmable memory address and decode circuit 1000.

For the decode circuit 1000 of the present invention, shown in FIG. 10, the driver transistors, e.g. transistors 1001-1, 1001-2, . . . , 1001-N in the array are floating gate transistor devices. In one embodiment, the floating gate driver transistors 1001-1, 1001-2, . . . , 1001-N are formed according to the embodiments of the present invention as disclosed and described in detail in connection with FIGS. 3A–8E. In this manner, the floating gate driver transistors, 1001-1, 1001-2, . . . , 1001-N, can be programmed initially in fabrication and can be reprogrammed as necessary once the decode array is in service, e.g. field programmable, to implement a specific decode function. The load devices 1016, shown in the address decoder 1000 of FIG. 10, are p-channel metal oxide semiconductor (PMOS) transistors and not depletion mode n-channel transistors as is more usual. In this manner, the decode circuit 1000 embodiment of the present invention shown in FIG. 10 is formed according to a CMOS process and can be referred to as a CMOS decode array 1000.

In one embodiment, as shown in FIG. 10, the decode circuit 1000 of the present invention includes at least one redundant row line, RD. In the embodiment shown in FIG. 10, a number of additional floating gate driver transistors, e.g. transistors T1–T6, are provided in the array coupled to address lines A1 through A3 or inverse address lines, A1 through A3 and the redundant row line, RD. According to the teachings of the present invention, these additional driver transistors, e.g. transistors T1–T6, are formed according to the embodiments described and discussed in detail above in connection with FIGS. 3A–8E. In one embodiment, as described above according to the teachings of the present invention, the additional floating gate driver transistors, T1–T6, will have a vertical control gate formed by the address lines A1 through A3 or inverse address lines, A1 through A3. In another embodiment, as described above according to the teachings of the present invention, the additional floating gate driver transistors, T1–T6, will have a horizontal control gate formed by the address lines A1 through A3 or inverse address lines, A1 through A3 located above the floating gates of the floating gate driver transistors, T1–T6. According to the teachings of the present invention, the ultra thin single crystalline vertical second source/drain region for the additional driver transistors, T1–T6, are coupled to the at least one redundant row line, or wordline, RD. A p-channel metal oxide semiconductor (PMOS) load transistor T7, similar to p-channel metal oxide semiconductor (PMOS) load transistors 1016 is coupled to the at least one redundant row line, RD as well to complete the CMOS inverter configuration.

As has been shown and described above, these non volatile, floating gate driver transistors, e.g. transistors T1–T6, can be programmed to have two different conductivity states depending upon whether electrons are stored on the vertical floating gate. When a charge is stored on the vertical floating gate for any one of these floating gate driver transistors, e.g. transistors T1–T6, the floating gate transistor is effectively removed from the programmable memory address and decode circuits 1000 of the present invention. The implementation of these floating gate driver transistors, e.g. transistors T1–T6, in the decode circuit 1000 of the present invention, enables error correction for replacing a row, or column in the array as one of ordinary skill in the art will understand upon reading this disclosure.

According to the teachings of the present invention, it is desirable to have redundant row lines, e.g. redundant row line RD, available to replace or error correct for row lines 1014, which are determined defective or which have failed in the field. The present invention is usable to provide such error correction by replacing a row, or column, in a memory decode circuit 1000.

One of ordinary skill in the art will understand upon reading this disclosure that there can be more than one redundant row line, e.g. a RD2, RD3, etc. (not shown), and similarly more additional floating gate driver transistors, like transistors T1–T6, coupled thereto in order to enable multiple row error correction. One of ordinary skill in the art will further understand, upon reading this disclosure, the manner in which the additional floating gate driver transistors, T1–T6, formed according to the teachings of the present invention, can be selectively programmed in order to access, or select, redundant rows RD in replacement for any one of the output lines 1014 in the decode array 1000.

In summary, If electrons are stored on a vertical floating gate for one of the additional floating gate driver transistors, T1–T6, then when a high input signal is received on address lines A1 through A3 or inverse address lines, A1 through A3, the programmed floating gate driver transistor, T1–T6, will remain "off." On the other hand, if there is no stored charge on the vertical floating gate for that particular floating gate driver transistors, T1–T6, then the floating gate driver transistors, T1–T6, will conduct when a high input signal is received on address lines A1 through A3 or inverse address lines, A1 through A3 associated with that floating gate driver transistor. If the floating gate driver transistors, T1–T6, have no charge stored on the vertical floating gate they will function as normal inverters for the decode circuit 1000.

Conversely, if there is a stored charge on the vertical floating gate, the conductivity of the floating gate driver transistors, T1–T6, will not become high enough and will not function as a driver transistor. In this latter case, the output for the redundant row line RD in the decode circuit 1000 of the present invention will not change charge states. Hence, if there is a charge stored on the vertical floating gate of the floating gate driver transistors, T1–T6, the drivers are effectively removed from the decode circuits 1000.

Analogously, the decode circuit shown in FIG. 10 can represent a column decode circuit 1000. In this case, the lines 1014 or redundant line RD which are coupled to the address lines A1 through A3 or inverse address lines, A1 through A3 through the floating gate driver transistors, 1001-1, 1001-2, . . . , 1001-N and T1–T6, can be complementary bit lines for column decoding as the same will be known and understood by one of ordinary skill in the art.

As one of ordinary skill in the art will further understand upon reading this disclosure, additional inverters can be used as necessary to affect the transition from one logic system, e.g. positive logic system, to a negative logic system while still capitalizing on the utility of the novel floating gate driver transistors 1001-1, 1001-2, . . . , 1001-N and T1–T6 in decode circuit 1000. If the floating gate in a floating gate driver transistor is programmed with a negative charge on the floating gate it will not be active in the array and it is effectively removed from the array. In this manner the array logic functions can be programmed even when the circuit is in the final circuit or in the field and being used in a system. The field programmable, in service or in circuit programmable, logic devices described here work with much lower voltages than the normal devices used in current in field, or in service, programmable decode circuit technology. They can be programmed with Voltages of 2.0 to 4.0 Volts and the normal operating voltages on the vertical control gates can be of the order 1.0 Volt or so.

The absence or presence of stored charge on the floating gates is read by addressing the x-address or control gate lines and y-column/sourcelines to form a coincidence in address at a particular floating gate. The control gate line would for instance be driven positive at some voltage of 1.0 Volts and the y-column/sourceline grounded, if the floating gate is not charged with electrons then the vertical sidewall transistor would turn on tending to hold the row or word address line on that particular row down indicating the presence of a stored "one" in the cell. If this particular floating gate is charged with stored electrons, the transistor will not turn on and the presence of a stored "zero" indicated in the cell. In this manner, data stored on a particular floating gate can be read. In reality, data is read out in "bit pairs" by addressing not only a single floating gate but rather both of the floating gates in row adjacent pillars on each side of a particular control gate address line. Data is stored into the cell by hot electron injection. In this case, the row or word address line coupled to the ultra thin single crystalline vertical second source/drain region is driven with a higher drain voltage like 2 Volts for 0.1 micron technology and the control gate line is addressed by some nominal voltage in the range of twice this value. Hot electrons generated in the channel of the ultra thin single crystalline vertical floating gate transistor will be injected through the gate or tunnel oxide on to the floating gate of the transistor selected by the address scheme. Erasure is accomplished by driving the control gate line with a negative voltage and the sourceline of the transistor with a positive bias so the total voltage difference is in the order of 3 Volts causing electrons to tunnel off of the floating gates. According to the teachings of the present invention, data can be erased in "bit pairs" since both floating gates on each side of a control gate can be erased at the same time. This architecture is amenable to block address schemes where sections of the array are erased and reset at the same time.

Figure 11:
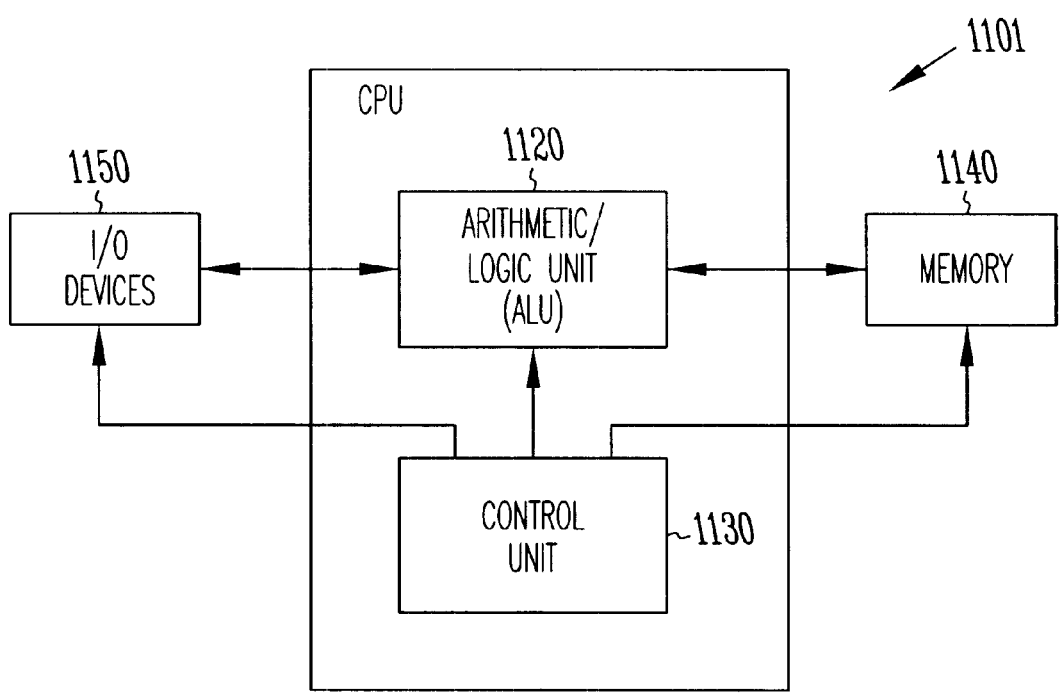
FIG. 11 is a simplified block diagram of a high-level organization of an electronic system according to the teachings of the present invention.

FIG. 11 is a simplified block diagram of a high-level organization of an electronic system 1101 according to the teachings of the present invention. As shown in FIG. 11, the electronic system 1101 is a system whose functional elements consist of an arithmetic/logic unit (ALU) 1120 or processor 1120, a control unit 1130, a memory device unit 1140 and an input/output (I/O) device 1150. Generally such an electronic system 1101 will have a native set of instructions that specify operations to be performed on data by the ALU 1120 and other interactions between the ALU 1120, the memory device unit 1140 and the I/O devices 1150. The memory device units 1140 contain the data plus a stored list of instructions.

The control unit 1130 coordinates all operations of the processor 1120, the memory device 1140 and the I/O devices 1150 by continuously cycling through a set of operations that cause instructions to be fetched from the memory device 1140 and executed. Memory device 1140 can be implemented with "in-service" programmable low voltage decode circuits, according to the teachings of the present invention. In addition, the decode circuits of the present invention can enable error correction by replacing a row, or column, in a memory array.

CONCLUSION

The above structures and fabrication methods have been described, by way of example, and not by way of limitation, with respect to programmable memory address and decode circuits with ultra thin body floating gate transistors. Different types of gate structures are shown which can be utilized on three different types of substrates to form the memory address and decode circuits.

It has been shown that higher and higher density requirements in memories, and consequently decode circuits, demand smaller and smaller dimensions for the structures and transistors. Conventional planar transistor structures are difficult to scale to the deep sub-micron dimensional regime. The present invention provides vertical floating gate transistor devices which are fabricated in ultra-thin single crystalline silicon films grown along the sidewall of an oxide pillar. These transistors with ultra-thin body regions scale naturally to smaller and smaller dimensions while preserving the performance advantage of smaller devices. The advantages of smaller dimensions for higher density and higher performance are both achieved in floating gate transistor arrays.

What is claimed is:

1. A decoder for a memory device, comprising:

a number of address lines;

a number of output lines;

wherein the address lines, and the output lines form an array; and a number of vertical pillars extending outwardly from a semiconductor substrate at intersections of output lines and address lines, wherein each pillar includes a single crystalline first contact layer and a second contact layer separated by an oxide layer;

a number of single crystalline ultra thin vertical floating gate transistors that are selectively disposed adjacent the number of vertical pillars, wherein each single crystalline vertical floating gate transistor includes;

an ultra thin single crystalline vertical first source/drain region coupled to the first contact layer;

an ultra thin single crystalline vertical second source/drain region coupled to the second contact layer; and an ultra thin single crystalline vertical body region which opposes the oxide layer and couples the first and the second source/drain regions; and a floating gate opposing the ultra thin single crystalline vertical body region;

a plurality of buried source lines formed of single crystalline semiconductor material and disposed below the pillars in the array for interconnecting with the first contact layer of pillars in the array; and wherein each of the number of address lines is disposed between rows of the pillars and opposes the floating gates of the single crystalline vertical floating gate transistors and serves as a control gate.

2. The decoder of claim 1, wherein the number of address lines includes a number of complementary address lines that are disposed in the array which serve as control gates for the number of single crystalline ultra thin vertical floating gate transistors selectively disposed along side of pillars at intersections of the complementary address lines with the output lines.

3. The decoder of claim 1, wherein the number of single crystalline ultra thin vertical floating gate transistors are each formed on one side of the number of vertical pillars with one of the address lines forming a control gate adjacent to the floating gates of the ultra thin single crystalline vertical floating gate transistors along a row of pillars, and wherein each output line is coupled to the second contact layer along a column of pillars.

4. The decoder of claim 1, wherein an ultra thin single crystalline vertical floating gate transistor is formed on two opposing sides of each pillar.

5. The decoder of claim 1, wherein in a column adjacent pair pillars an address line is formed in a trench between the column adjacent pair of pillars, the address line forming a control gate for a pair of floating gates in the column adjacent pair, and wherein each output line is coupled to the second contact layer in the column adjacent pair of pillars.

6. The decoder of claim 1, wherein at least one of the output lines includes a redundant wordline.

7. The decoder of claim 1, wherein the semiconductor substrate includes a silicon on insulator substrate.

8. A decoder for a memory device, comprising:

a number of address lines;

a number of output lines;

wherein the address lines, and the output lines form an array;

a number of vertical pillars extending outwardly from a semiconductor substrate at intersections of output lines and address lines, wherein each pillar includes a single crystalline first contact layer and a second contact layer separated by an oxide layer;

a number of single crystalline ultra thin vertical floating gate transistors that are disposed adjacent the number of vertical pillars, wherein each single crystalline vertical floating gate transistor includes;

an ultra thin single crystalline vertical first source/drain region coupled to the first contact layer;

an ultra thin single crystalline vertical second source/drain region coupled to the second contact layer; and an ultra thin single crystalline vertical body region which opposes the oxide layer and couples the first and the second source/drain regions;

wherein a horizontal junction depth for the first and the second ultra thin single crystalline vertical source/drain regions is much less than a vertical length of the ultra thin single crystalline vertical body region; and a floating gate opposing the vertical body region and separated therefrom by a gate oxide;

a plurality of buried source lines formed of single crystalline semiconductor material and disposed below the pillars in the array for interconnecting with the first contact layer of pillars in the array; and wherein each of the number of address lines is disposed between rows of the pillars and opposes the floating gates of the single crystalline vertical floating gate transistors for serving as a control gate.

9. The decoder of claim 8, wherein the ultra thin single crystalline vertical body region includes a channel having a vertical length of less than 100 nanometers.

10. The decoder of claim 8, wherein the ultra thin single crystalline vertical body region has a horizontal width of less than 10 nanometers.

11. The decoder of claim 8, wherein the ultra thin single crystalline vertical body region is formed from solid phase epitaxial growth.

12. The decoder of claim 8, wherein the plurality of buried source lines are more heavily doped than the first contact layer and are formed integrally with the first contact layer.

13. The decoder of claim 8, wherein the semiconductor substrate includes a silicon on insulator substrate.

14. A programmable decode circuit for a semiconductor memory, comprising:

a number of address lines;

a number of output lines;

wherein the address lines, and the output lines form an array;

a number of vertical pillars extending outwardly from a semiconductor substrate at intersections of output lines and address lines, wherein each pillar includes a single crystalline first contact layer and a second contact layer separated by an oxide layer;

a pair of single crystalline ultra thin vertical floating gate transistors formed along opposing sides of each pillar, wherein each single crystalline vertical floating gate transistor includes;

an ultra thin single crystalline vertical first source/drain region coupled to the first contact layer;

an ultra thin single crystalline vertical second source/drain region coupled to the second contact layer; and an ultra thin single crystalline vertical body region which opposes the oxide layer and couples the first and the second source/drain regions;

wherein a surface space charge region for the single crystalline vertical transistor scales down as other dimensions of the transistor scale down; and a floating gate opposing the vertical body region and separated therefrom by a gate oxide, and wherein the floating gate is formed in a trench between rows of the number of pillars and is shared between the ultra thin single crystalline vertical floating gate transistors that are adjacent the trench in column adjacent pillars;

a plurality of buried source lines formed of single crystalline semiconductor material and disposed below the pillars in the array for interconnecting with the first contact layer of pillars in the array; and wherein each of the number of address lines is disposed between rows of the pillars and opposes the floating gates of the single crystalline vertical floating gate transistors for serving as a control gate.

15. The programmable decode circuit of claim 14, wherein each address line integrally forms a control gate for addressing floating gates in the trench and is isolated from the floating gates by an insulator layer.

16. The programmable decode circuit of claim 14, wherein each ultra thin single crystalline vertical body region includes a p-type channel having a vertical length of less than 100 nanometers.

17. The programmable decode circuit of claim 14, wherein the number of buried source lines are formed integrally with the first contact layer and are separated from the semiconductor substrate by an oxide layer.

18. The programmable decode circuit of claim 14, wherein each address line includes a horizontally control line having a vertical side length of less than 100 nanometers.

19. A decode circuit for a semiconductor memory, comprising:
a number of address lines;
a number of output lines;
wherein the address lines, and the output lines form an array;
a number of vertical pillars extending outwardly from a semiconductor substrate at intersections of output lines and address lines, wherein each pillar includes a single crystalline first contact layer and a second contact layer separated by an oxide layer;
a pair of single crystalline ultra thin vertical floating gate transistors formed opposing sides of each pillar, wherein each single crystalline vertical floating gate transistor includes;
an ultra thin single crystalline vertical first source/drain region coupled to the first contact layer;
an ultra thin single crystalline vertical second source/drain region coupled to the second contact layer;
an ultra thin single crystalline vertical body region which opposes the oxide layer and couples the first and the second source/drain regions; and
a floating gate opposing the vertical body region in a trench and separated therefrom by a tunnel oxide; and
wherein each of the number of address lines is disposed between rows of the pillars and is shared as a control gate for addressing floating gates on opposing sides of the trench in column adjacent pillars.

20. The decode circuit of claim 19, wherein each of the number of address lines is located in the trench between the floating gates on opposing sides of the trench in column adjacent pillars, and wherein each of the number of address lines includes a vertically oriented address line having a vertical length of less than 100 nanometers.

21. The decode circuit of claim 19, wherein each single crystalline vertical floating gate transistor has a vertical length of less than 100 nanometers and a horizontal width of less than 10 nanometers.

22. The decode circuit of claim 19, wherein the number of address lines in alternating row adjacent trenches includes a complementary address line.

23. The decode circuit of claim 19, wherein each of the number of output lines is coupled to the second contact layer in column adjacent pillars.

24. A memory address decoder, comprising:
a number of address lines;
a number of output lines;
wherein the address lines, and the output lines form an array;
a number of vertical pillars extending outwardly from a semiconductor substrate at intersections of output lines and address lines, wherein each pillar includes a single crystalline first contact layer and a second contact layer separated by an oxide layer;
a pair of single crystalline ultra thin vertical floating gate transistors along opposing sides of each pillar, wherein each single crystalline vertical floating gate transistor includes;
an ultra thin single crystalline vertical first source/drain region coupled to the first contact layer;
an ultra thin single crystalline vertical second source/drain region coupled to the second contact layer; and
an ultra thin single crystalline vertical body region which opposes the oxide layer and couples the first and the second source/drain regions;
a floating gate opposing the vertical body region and separated therefrom by a gate oxide; and
wherein each of the number of address lines is disposed in a trench between rows of the pillars and is shared as a control gate for addressing floating gates on opposing sides of the trench in column adjacent pillars.

25. The memory address decoder of claim 24, wherein the memory address decoder further includes a plurality of buried source lines formed of single crystalline semiconductor material and disposed below the pillars in the array for interconnecting with the first contact layer of column adjacent pillars in the array.

26. The memory address decoder of claim 24, wherein each of the number of output lines is coupled to the second contact layer of column adjacent pillars.

27. The memory address decoder of claim 24, wherein each of the number of address lines includes a vertically oriented address line having a vertical length of less than 100 nanometers.

28. The memory address decoder of claim 24, wherein each single crystalline vertical floating gate transistor has a vertical length of less than 100 nanometers and a horizontal width of less than 10 nanometers.

29. An address decode circuit, comprising:
a number of address lines;
a number of data lines that are selectively coupled to the address lines;
wherein the address lines and the data lines form an array; and
a number of single crystalline ultra thin vertical floating gate transistors that are selectively disposed at intersections of data lines and address lines, wherein each single crystalline vertical floating gate transistor includes;
an ultra thin single crystalline vertical first source/drain region;
an ultra thin single crystalline vertical second source/drain region;
an ultra thin single crystalline vertical body region which couples the first and the second source/drain regions; and
a floating gate opposing the vertical body region and separated therefrom by a gate oxide;
wherein each of the number of data lines is coupled to the second source/drain region in column adjacent pillars; and
wherein the number of address lines integrally form control lines opposing the floating gates of the single crystalline ultra thin vertical floating gate transistors such that the single crystalline ultra thin vertical floating gate transistors implement a logic function that selects a data line responsive to an address provided to the address lines and a charge stored on the floating gates.

30. The address decode circuit of claim 29, wherein each of the address lines includes a vertically oriented address line having a vertical length of less than 100 nanometers and formed in a trench between floating gates.

31. The address decode circuit of claim 29, wherein each single crystalline vertical floating gate transistor has a vertical length of less than 100 nanometers and a horizontal width of less than 10 nanometers.

32. The address decode circuit of claim 29, wherein each of the address lines includes a horizontally oriented address line located above the floating gates for row adjacent single crystalline vertical floating gate transistors.

33. A memory device, comprising:
an array of wordlines and complementary bit line pairs;
a number of memory cells that are each addressably coupled at intersections of a word line with a bit line of a complementary bit line pair;
a row decoder that is coupled to the wordlines so as to implement a logic function that selects one of the wordlines responsive to an address provided to the row decoder on a number of first address lines;
a number of sense amplifiers, each coupled to a complementary pair of bit lines;
a column decoder that is coupled to the sense amplifiers so as to implement a logic function that selects one of the complementary pairs of bit lines responsive to an address provided to the column decoder on a number of second address lines; and
wherein the row decoder comprises an array of single crystalline ultra thin vertical floating gate transistors that are selectively coupled to implement a logic function that selects a wordline based on addresses supplied on the number of first address lines, wherein each single crystalline vertical floating gate transistor includes;
an ultra thin single crystalline vertical first source/drain region;
an ultra thin single crystalline vertical second source/ drain region;
an ultra thin single crystalline vertical body region which couples the first and the second source/drain regions
a floating gate opposing the vertical body region and separated therefrom by a gate oxide.

34. The memory device of claim 33, wherein each of the first address lines are formed in a trench opposing the floating gates, and wherein each of the first address lines include vertically oriented address lines having a vertical length of less than 100 nanometers.

35. The memory device of claim 33, wherein each of the first address lines include horizontally oriented address lines formed above the floating gates.

36. The memory device of claim 33, wherein each of the wordlines couples to the second source/drain region of the single crystalline vertical floating gate transistors in the row decoder.

37. The memory device of claim 33, wherein each single crystalline vertical floating gate transistor has a vertical length of less than 100 nanometers and a horizontal width of less than 10 nanometers.

38. The memory device of claim 33, wherein the column decoder includes an array of single crystalline ultra thin vertical floating gate transistors that are selectively coupled to implement a logic function that selects one of the complementary pairs of bit lines responsive to addresses provided to the column decoder one the number of second address lines, wherein each single crystalline vertical floating gate transistor includes:
an ultra thin single crystalline vertical first source/drain region;
an ultra thin single crystalline vertical second source/drain region;
an ultra thin single crystalline vertical body region which couples the first and the second source/drain regions; and
a floating gate opposing the vertical body region and separated therefrom by a gate oxide.

39. The memory device of claim 38, wherein the complementary pairs of bit lines couple to the second source/drain regions of the single crystalline vertical floating gate transistors in the column row decoder.

40. An electronic system, comprising:
a processor; and
a memory device coupled to processor, wherein the memory device includes a programmable decoder comprising:
a number of address lines;
a number of output lines;
wherein the address lines, and the output lines form an array;
a number of vertical pillars extending outwardly from a semiconductor substrate at intersections of output lines and address lines, wherein each pillar includes a single crystalline first contact layer and a second contact layer separated by an oxide layer;
a pair of single crystalline ultra thin vertical floating gate transistors formed along opposing sides of each pillar, wherein each single crystalline vertical floating gate transistor includes;
an ultra thin single crystalline vertical first source/ drain region coupled to the first contact layer;
an ultra thin single crystalline vertical second source/ drain region coupled to the second contact layer; and
an ultra thin single crystalline vertical body region which opposes the oxide layer and couples the first and the second source/drain regions;
wherein a surface space charge region for the single crystalline vertical transistor scales down as other dimensions of the transistor scale down; and
a floating gate opposing the vertical body region and separated therefrom by a gate oxide, and wherein the floating gate is formed in a trench between rows of the number of pillars and is shared between the ultra thin single crystalline vertical floating gate transistors that are adjacent the trench in column adjacent pillars;
a plurality of buried source lines formed of single crystalline semiconductor material and disposed below the pillars in the array for interconnecting with the first contact layer of pillars in the array; and
wherein each of the number of address lines is disposed between rows of the pillars and opposes the floating gates of the single crystalline vertical floating gate transistors for serving as a control gate.

41. The electronic system of claim 40, wherein each address line integrally forms a control gate for addressing floating gates in the trench and is isolated from the floating gates by an insulator layer.

42. The electronic system of claim 40, wherein each ultra thin single crystalline vertical body region includes a p-type channel having a vertical length of less than 100 nanometers.

43. The electronic system of claim 40, wherein the plurality of buried source lines are formed integrally with the first contact layer and are separated from the semiconductor substrate by an oxide layer.

44. The electronic system of claim 40, wherein each address line includes a horizontally oriented control line having a vertical side length of less than 100 nanometers.

45. A electronic system, comprising:
   a processor; and
   a memory device coupled to processor, wherein the memory device includes a programmable memory address decoder comprising:
      a number of address lines;
      a number of output lines;
      wherein the address lines, and the output lines form an array;
      a number of vertical pillars extending outwardly from a semiconductor substrate at intersections of output lines and address lines, wherein each pillar includes a single crystalline first contact layer and a second contact layer separated by an oxide layer;
      a pair of single crystalline ultra thin vertical floating gate transistors formed on opposing sides of each pillar, wherein each single crystalline vertical floating gate transistor includes;
         an ultra thin single crystalline vertical first source/drain region coupled to the first contact layer;
         an ultra thin single crystalline vertical second source/drain region coupled to the second contact layer;
         an ultra thin single crystalline vertical body region which opposes the oxide layer and couples the first and the second source/drain regions; and
         a floating gate opposing the vertical body region in a trench and separated therefrom by a tunnel oxide; and
      wherein each of the number of address lines is disposed between rows of the pillars and is shared as a control gate for addressing floating gates on opposing sides of the trench in column adjacent pillars.

46. The electronic system of claim 45, wherein each of the number of address lines is located in the trench between floating gates on opposing sides of the trench in column adjacent pillars, and wherein each of the number of address lines includes a vertically oriented address line having a vertical length of less than 100 nanometers.

47. The electronic system of claim 45, wherein each single crystalline vertical floating gate transistor has a vertical length of less than 100 nanometers and a horizontal width of less than 10 nanometers.

48. The electronic system of claim 45, wherein the number of address lines in alternating row adjacent trenches includes a complementary address line.

49. The electronic system of claim 45, wherein each of the number of output lines is coupled to the second contact layer in column adjacent pillars.

50. A electronic system, comprising:
   a processor; and
   a memory device coupled to the processor, wherein the memory device includes a memory address decoder comprising:
      a number of address lines;
      a number of output lines;
      wherein the address lines, and the output lines form an array;
      a number of vertical pillars extending outwardly from a semiconductor substrate at intersections of output lines and address lines, wherein each pillar includes a single crystalline first contact layer and a second contact layer separated by an oxide layer;
      a pair of single crystalline ultra thin vertical floating gate transistors along opposing sides of each pillar, wherein each single crystalline vertical floating gate transistor includes;
         an ultra thin single crystalline vertical first source/drain region coupled to the first contact layer;
         an ultra thin single crystalline vertical second source/drain region coupled to the second contact layer; and
         an ultra thin single crystalline vertical body region which opposes the oxide layer and couples the first and the second source/drain regions;
         a floating gate opposing the vertical body region and separated therefrom by a gate oxide; and
      wherein each of the number of address lines is disposed in a trench between rows of the pillars and is shared as a control gate for addressing floating gates on opposing sides of the trench in column adjacent pillars.

51. The electronic system of claim 50, wherein the memory address decoder further includes a plurality of buried source lines formed of single crystalline semiconductor material and disposed below the pillars in the array for interconnecting with the first contact layer of column adjacent pillars in the array.

52. The electronic system of claim 50, wherein each of the number of output lines is coupled to the second contact layer of column adjacent pillars.

53. The electronic system of claim 50, wherein each of the number of address lines includes a vertically oriented address line having a vertical length of less than 100 nanometers.

54. The electronic system of claim 50, wherein each single crystalline vertical floating gate transistor has a vertical length of less than 100 nanometers and a horizontal width of less than 10 nanometers.

* * * * *

UNITED STATES PATENT AND TRADEMARK OFFICE
CERTIFICATE OF CORRECTION

PATENT NO. : 6,566,682 B2
DATED : May 20, 2003
INVENTOR(S) : Leonard Forbes

It is certified that error appears in the above-identified patent and that said Letters Patent is hereby corrected as shown below:

Column 3,
Line 50, delete "which" after "sequence".

Column 5,
Line 51, delete "(rim)" and insert -- (nm) -- therefor.

Column 7,
Line 44, delete "mn" after "10" and insert -- nm -- therefor.

Column 13,
Line 45, delete "can" after "is".

Column 16,
Line 54, delete "If" and insert -- if -- therefor.

Column 24,
Line 6, delete "one" and insert -- on -- therefor.

Signed and Sealed this

Ninth Day of September, 2003

JAMES E. ROGAN
*Director of the United States Patent and Trademark Office*